US006863942B2

(12) United States Patent
Ren et al.

(10) Patent No.: US 6,863,942 B2
(45) Date of Patent: Mar. 8, 2005

(54) FREE-STANDING AND ALIGNED CARBON NANOTUBES AND SYNTHESIS THEREOF

(75) Inventors: Zhifeng Ren, East Amherst, NY (US); Zhongping Huang, Cheektowaga, NY (US); Jui H. Wang, Amherst, NY (US); Dezhi Wang, Williamsville, NY (US)

(73) Assignee: The Research Foundation of State University of New York, Amherst, NY (US)

( * ) Notice: Subject to any disclaimer, the term of this patent is extended or adjusted under 35 U.S.C. 154(b) by 0 days.

(21) Appl. No.: 09/336,126

(22) Filed: Jun. 18, 1999

(65) Prior Publication Data

US 2003/0203139 A1 Oct. 30, 2003

Related U.S. Application Data

(60) Provisional application No. 60/089,965, filed on Jun. 19, 1998, and provisional application No. 60/099,708, filed on Sep. 10, 1998.

(51) Int. Cl.[7] .......................... B29D 22/00; B29D 23/00; B32B 1/08; H01J 1/62; H01J 63/04
(52) U.S. Cl. .............. 428/36.9; 423/445 R; 423/445 B; 423/447.2; 423/448; 423/449.1; 423/DIG. 39; 423/DIG. 40; 313/495; 313/496; 313/497; 345/75.2; 315/169.1; 315/169.3
(58) Field of Search ............................. 428/36.9, 36.91, 428/36.92, 34.1; 423/445 R, 445 B, 447.2, 448, 449.1, DIG. 39, DIG. 40; 313/495, 309, 351, 497, 311, 553, 558, 496; 345/75.2; 315/169.1, 169.3

(56) References Cited

U.S. PATENT DOCUMENTS

| | | |
|---|---|---|
| 3,919,550 A | 11/1975 | Banbury |
| 4,684,581 A | 8/1987 | Struthers |
| 4,943,493 A | 7/1990 | Vartanian |
| 5,185,922 A | 2/1993 | Pendley et al. |
| 5,346,683 A * | 9/1994 | Green et al. ............. 423/447.2 |

(List continued on next page.)

FOREIGN PATENT DOCUMENTS

| | | |
|---|---|---|
| JP | 407061803 A | 3/1995 |
| JP | 410265208 A | 10/1998 |
| WO | WO 95/10481 A1 | 4/1995 |
| WO | WO 96/09246 A1 | 3/1996 |

OTHER PUBLICATIONS

Chen et al., "Well–aligned Graphitic Nanofibers Synthesized by Plasma–assisted Chemical Vapor Deposition," Chemical Physics Letters 272: 178–182, 1997.*
Chen et al., "Field Emission from Aligned High–density Graphitic Nanofibers," Applied Physics Letters 73(15):2119–2121,1998.*
Chen et al., "Plasma–induced Low Temperature Growth of Graphitic Nanofibers on Nickel Substrates," Journal of Crystal Growth 193:342–346, 1998.*

(List continued on next page.)

Primary Examiner—Michael C. Miggins
(74) Attorney, Agent, or Firm—Nixon Peabody LLP

(57) ABSTRACT

One or more highly-oriented, multi-walled carbon nanotubes are grown on an outer surface of a substrate initially disposed with a catalyst film or catalyst nano-dot by plasma enhanced hot filament chemical vapor deposition of a carbon source gas and a catalyst gas at temperatures between 300° C. and 3000° C. The carbon nanotubes range from 4 to 500 nm in diameter and 0.1 to 50 μm in length depending on growth conditions. Carbon nanotube density can exceed $10^4$ nanotubes/mm². Acetylene is used as the carbon source gas, and ammonia is used as the catalyst gas. Plasma intensity, carbon source gas to catalyst gas ratio and their flow rates, catalyst film thickness, and temperature of chemical vapor deposition affect the lengths, diameters, density, and uniformity of the carbon nanotubes. The carbon nanotubes of the present invention are useful in electrochemical applications as well as in electron emission, structural composite, material storage, and microelectrode applications.

24 Claims, 20 Drawing Sheets

U.S. PATENT DOCUMENTS

| | | | |
|---|---|---|---|
| 5,366,820 A | | 11/1994 | Tsutsumi et al. |
| 5,457,343 A | * | 10/1995 | Ajayan et al. ............... 257/734 |
| 5,569,635 A | | 10/1996 | Moy et al. |
| 5,589,152 A | | 12/1996 | Tennent et al. |
| 5,648,056 A | | 7/1997 | Tanaka |
| 5,650,370 A | | 7/1997 | Tennent et al. |
| 5,707,916 A | | 1/1998 | Snyder et al. |
| 5,726,116 A | | 3/1998 | Moy et al. |
| 5,726,524 A | * | 3/1998 | Debe .......................... 313/309 |
| 5,753,088 A | | 5/1998 | Olk |
| 5,780,101 A | * | 7/1998 | Nolan et al. ................. 427/216 |
| 5,888,670 A | | 3/1999 | Kawakami |
| 5,916,642 A | * | 6/1999 | Chang ......................... 427/580 |
| 6,129,901 A | | 10/2000 | Moskovits et al. |

OTHER PUBLICATIONS

Amsted Industries Inc., Description of First Prior Art Picker System, Nov. 2, 1999, p. 1.

Amsted Industries, Inc., Description of Prior Art Pneumatic Picker System, Nov. 2, 1999, pp. 1–2 and attached photograph.

Huang et al., "Growth of Highly Oriented Carbon Nanotubes by Plasma–Enhanced Hot Filament Chemical Vapor Deposition", *Applied Physics Letters*, 73:3845–3847 (1998).

Ren et al., "Synthesis of Large Arrays of Well–Aligned Carbon Nanotubes on Glass," *Science*, 282:1105–1107 (1998).

Ren et al., "Large Arrays of Well–Aligned Carbon Nanotubes", Proceedings of 13$^{th}$ International Winter School on Electronic Properties of Novel Materials, Kirchberg/Tirol, Austria (Feb. 27–Mar. 6, 1999).

Ren et al., "Growth of a Single Free–Standing Multiwall Carbon Nanotube on Each Nano–Nickel Dot," *Applied Physics Letters*, 75:1086–1088 (1999).

Li et al., "Large–Scale Synthesis of Aligned Carbon Nanotubes", *Science*, 274:1701–1703 (1996).

Iijima, "Helical Microtubules of Graphitic Carbon", *Nature*, 354:56–58 (1991).

Thess et al., "Crystalline Ropes of Metallic Carbon Nanotubes," *Science*, 273:483–487 (1996).

Journet et al., "Large–Scale Production of Single–Walled Carbon Nanotubes by the Electric–Arc Technique", *Nature*, 388:756–758 (1997).

Setlur et al., "A Method for Synthesizing Large Quantities of Carbon Nanotubes and Encapsulated Copper Nanowires," *Appl. Phys. Lett.*, 69:345–347 (1996).

Liu et al., "Fullerene Pipes," *Science*, 280:1253–1256 (1998).

Frank et al., "Carbon Nanotube Quantum Resistors," *Science*, 280:1744–1746 (1998).

Gadd et al., "The World's Smallest Gas Cylinders?," *Science*, 277:933–936 (1997).

Dillon et al, "Storage of Hydrogen in Single–Walled Carbon Nanotubes," *Nature*, 386:377–379 (1997).

de Heer et al., "Aligned Carbon Nanotube Films: Production and Optical and Electronic Properties," *Science*, 268:845–847 (1995).

Nagy et al., "Carbon Nanotube Tipped Atomic Force Microscopy for Measurement of <100 nm Etch Morphology on Semiconductors," *Applied Physics Letters*, 73:529–531 (1998).

Fan et al., "Self–Oriented Regular Arrays of Carbon Nanotubes and Their Field Emission Properties," *Science*, 283:512–514 (1999).

Wong et al., "Covalently Functionalized Nanotubes as Nanometre–Sized Probes in Chemistry and Biology," *Nature*, 394:52–55 (1998).

Schmid et al., "Carbon Nanotubes are Coherent Electron Sources," *Appl. Phys. Lett.*, 70:2679–2680 (1997).

Dai et al., "Nanotubes as Nanoprobes in Scanning Probe Microscopy," *Nature*, 384:147–150 (1996).

Wang et al., "A Nanotube–Based Field–Emission Flat Panel Display," *Applied Physics Letters*, 72:2912–2913 (1998).

Küttel et al., "Electron Field Emission From Phase Pure Nanotube Films Grown in a Methane/Hydrogen Plasma," *Applied Physics Letters*, 73:2113–2115 (1998).

Rinzler et al., "Unraveling Nanotubes: Field Emission From an Atomic Wire," *Science*, 269:1550–1553 (1995).

Che et al., "Carbon Nanotube Membranes for Electrochemical Energy Storage and Production," *Nature*, 393:346–349 (1998).

Terrones et al., "Controlled Production of Aligned–Nanotube Bundles," *Nature*, 388:52–55 (1997).

de Heer et al., "A Carbon Nanotube Field–Emission Electron Source," *Science*, 270:1179–1180 (1995).

Yang et al., "Nanorod–Superconductor Composites: A Pathway to Materials with High Critical Current Densities," *Science*, 273:1836–1840 (1996).

Fan et al., "Self–Oriented Regular Arrays of Carbon Nanotubes and Their Field Emission Properties," *Science*, 283:512–14 (1999).

Collins et al., "A Simple and Robust Electron Beam Source From Carbon Nanotubes," *Appl. Phys. Lett.*, 69:1969–1971 (1996).

Collins et al., "Unique Characteristics of Cold Cathode Carbon–Nanotube–Matrix Field Emitters," *The American Physical Society*, 55:9391–9399 (1997).

Ajayan et al., "Aligned Carbon Nanotubes Arrays Formed by Cutting a Polymer Resin–Nanotube Composite," *Science*, 265:1212–1214 (1994).

Yudaska et al., "Behavior of Ni in Carbon Nanotube Nucleation," *Appl. Phys. Lett.*, 70:1817–1818 (1997).

Charlier et al., "Microscopic Growth Mechanisms for Carbon Nanotubes," *Science*, 275:646–649 (1997).

Collins et al., "Nanotube Nanodevice," *Science*, 278:100–103 (1997).

Bower et al., "Deformation of Carbon Nanotubes in Nanotube–Polymer Composites," *Appl. Phys. Lett.* (in press).

Gao et al., "Electrochemical Intercalation of Single–Walled Carbon Nanotubes with Lithium," *Chem. Phys. Lett.*, 307:153–157 (1999).

Stulík et al., "Microelectrodes: Definitions, Characterisation and Hints For Their Use", *IUPAC Commission*, Document No. 550/61/97 (1999).

Chen et al., "Well–aligned Graphitic Nanofibers Synthesized by Plasma–assisted Chemical Vapor Deposition," *Chemical Physics Letters* 272:178–182 (1997).

Chen et al., "Field Emission from Aligned High–density Graphitic Nanofibers," *Applied Physics Letters* 73(15):2119–2121 (1998).

Chen et al., "Plasma–induced Low temperature Growth of Graphitic Nanofibers on Nickel Substrates," *Journal of Crystal Growth* 193:342–346 (1998).

* cited by examiner

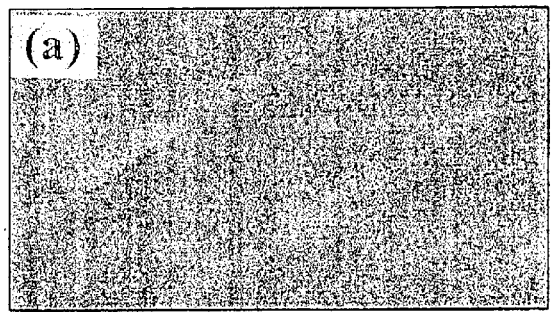
FIG. 18A 27μM
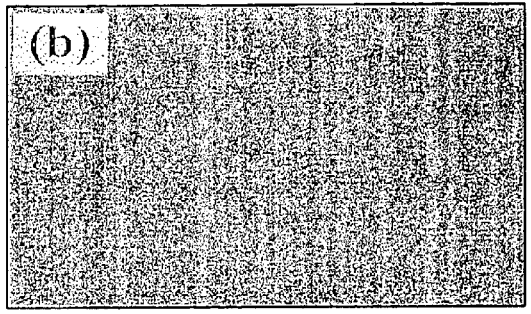
FIG. 18B 86μM
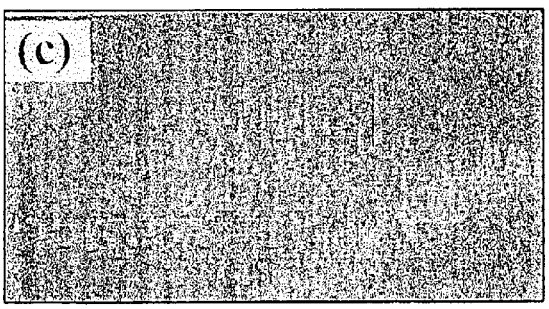
FIG. 18C 12μM
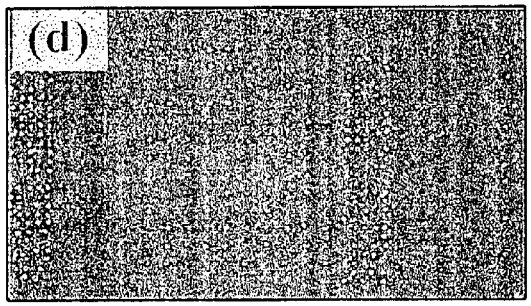
FIG. 18D 20μM
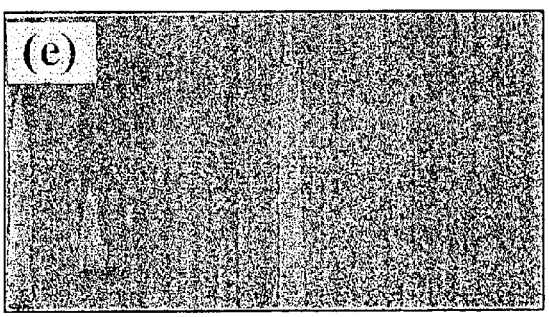
FIG. 18E 3μM
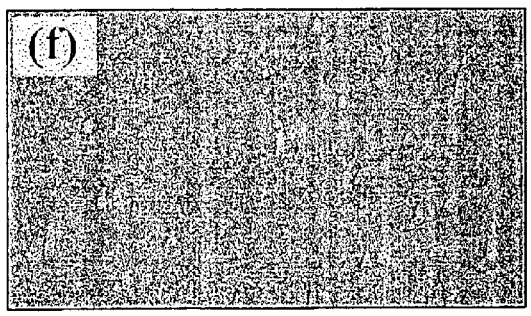
FIG. 18F 10μM

FREE-STANDING AND ALIGNED CARBON NANOTUBES AND SYNTHESIS THEREOF

This application claims the benefit of U.S. Provisional Patent Application Ser. No. 60/089,965, filed Jun. 19, 1998, and U.S. Provisional Patent Application Ser. No. 60/099,708, filed Sep. 10, 1998.

This invention was made through the support of the U.S. Army Research Office (Grant No. DAAG55-97-1-0139). The Federal Government may retain certain rights in the invention.

FIELD OF THE INVENTION

The present invention relates to a product with a substrate having one or more carbon nanotubes, a method of producing that product, and devices utilizing the product.

BACKGROUND OF THE INVENTION

Since the first observation of carbon nanotubes, numerous papers have reported studies on the yield of well-graphitized nanotubes, their diameter and wall thickness (single or multiple), growth mechanisms, alignment, electron emission properties, nanodevices, theoretical predictions, and potential applications. Selective positioning and growth of carbon nanotubes is necessary for future integration with conventional microelectronics as well as the development of novel devices. However, limited progress has been reported in the controlled placement of nanotubes. Alignment of the carbon nanotubes is particularly important to enable both fundamental studies and applications, such as cold-cathode flat panel displays, chargeable batteries, and vacuum microelectronics.

Specifically, vertical alignment has been an important goal due to its technological importance for applications such as scanning probe microscopy and field emission flat panel displays. Attempts to manipulate nanotubes for these applications have been made by post-growth methods such as cutting a polymer resin-nanotube composite, or drawing a nanotube-ethanol suspension through a ceramic filter. Because these techniques are difficult and labor intensive, in situ aligning of nanotubes during growth using techniques such as the nanopores of porous alumina membranes and laser etched nanotracts have been attempted.

There has been little success in obtaining alignment of carbon nanotubes on large areas until the report by Li et al., "Large-Scale Synthesis of Aligned Carbon Nanotubes," Science, 274:1701–1703 (1996) ("Li"). Li discusses the growth of aligned carbon nanotubes on mesoporous silica containing iron nanoparticles via thermal decomposition of acetylene gas in nitrogen gas at temperatures above 700° C. In this method, the substrate is prepared by a sol-gel process from tetraethoxysilane hydrolysis in iron nitrate aqueous solution. The gel is then calcined 10 hours at 450° C. at $10^{-2}$ Torr. A silica network with relatively uniform pores is obtained with iron oxide nanoparticles embedded in the pores. The iron oxide nanoparticles are then reduced at 550° C. in 180 Torr of flowing (9% $H_2/N_2$ (110 $cm^3$/min) for 5 hours to obtain iron nanoparticles. Thereafter, nanotubes are grown in a gas environment of a mixture of 9% acetylene in nitrogen at 700° C. Aligned nanotube growth is along the axial direction of the pores. Only the nanotubes which grow out of the vertical pores are aligned. Nanotubes which grow from the iron particles on the surface and in the dispersed, inclined pores are random and non-oriented. In this method, nanotube alignment is limited to the constraint of the vertically aligned pores. Further, the density and diameter of aligned carbon nanotubes is respectively limited in direct proportion to the amount and size of the iron nanoparticles and the diameter of the pores.

As disclosed in Li, a temperature of at least 700° C. is required to decompose acetylene and induce carbon nanotube growth. Unfortunately, this high temperature requirement limits substrate selection. For example, a glass substrate is unsuited for use in this method due to its low strain point temperature. A glass produced by Corning Incorporated (Corning, N.Y.) has the highest known flat panel display glass deformation or strain point temperature of 666° C. Typically, a commercially available flat panel display glass has a strain point temperature between 500° C. and 590° C. At 700° C., glass substrates deform and inhibit aligned carbon nanotube growth. Accordingly, any substrate suitable for use with this method must have a melting point or strain point temperature above 700° C.

Terrones et al., "Controlled Production of Aligned-Nanotube Bundles," Nature, 388: 52–55 (1997) ("Terrones") disclose a method for laser induced growth of nanotube bundles aligned on a substrate under high temperature conditions. A thin film of cobalt is deposited on a silica plate by laser ablation and thereafter etched with a single laser pulse to create linear nanotracks. 2-amino-4,6-dichloro-s-triazine is then disposed onto the silica plate in the presence of argon gas within a two stage oven. The first oven is heated to 1,000° C. and then allowed to cool to room temperature. The second oven is heated to and maintained at 950° C. Although carbon nanotubes grow along the edges of the eroded nanotracks, growth only occurs on the substrate bottom surface and in a non-vertical fashion. Carbon nanotubes do not grow on a similarly prepared substrate top surface which indicates nanotube growth according to this method is gravity dependent. Again, for the reasons discussed above, substrate selection for this method is limited to a substrate having either a strain point or melting point temperature above 1,000° C. Further, nanotube density is directly limited to the number of nanotracks etched into the substrate surface.

Thus, there remains a need for a method of forming aligned, vertically or otherwise, carbon nanotubes at temperatures below 700° C. Similarly, there remains a need for a substrate which has carbon nanotubes vertically aligned on the substrate surface. Further, there remains a need for a method of forming individual, free-standing carbon nanotubes, and a substrate with one or more individual, free-standing carbon nanotubes disposed on the substrate surface. The present invention is directed to overcoming these deficiencies in the art.

SUMMARY OF THE INVENTION

The present invention relates to a product which has a substrate and either (1) a plurality of substantially aligned carbon nanotubes of a density greater than $10^4$ nanotubes per square millimeter of substrate, (2) a plurality of substantially aligned carbon nanotubes of a density no greater than $10^2$ nanotubes per square millimeter of a substrate, (3) one or more carbon nanotubes, wherein the substrate has a strain point or melting point temperature between about 300° C. and 700° C., (4) a plurality of substantially aligned carbon nanotubes originating and extending outwardly from the substrate outer surface, or (5) one or more free-standing carbon nanotubes originating and extending outwardly from the substrate outer surface.

Carbon nanotubes are synthesized by plasma-enhanced hot filament chemical vapor deposition of a carbon source gas in a reduced pressure environment in the presence of a catalyst gas at temperatures as low as between 300° C. and 3000° C. in a volume ratio range of carbon source gas to catalyst gas from 1:2 to 1:10. Growth of large arrays of well-aligned carbon nanotubes having a diameter between 4 to 500 nm occur on a substrate coated with a thin metal catalyst film. Free-standing carbon nanotubes are grown on metal catalyst nano-dots disposed on the substrate.

The present invention provides a method of forming aligned, vertically or otherwise, carbon nanotubes at temperatures below 700° C. Further, products made in accordance with this method provide a substrate which has carbon nanotubes vertically aligned on the substrate surface. Further, a product made in accordance with the method of the present invention includes a substrate having individual, free-standing carbon nanotubes. Still further, a product made in accordance with the method of the present invention includes a substrate having one or more individual, free-standing carbon nanotubes disposed on the substrate surface. Products of the present invention are useful in electrochemical applications as well as in electron emission, structural composite, material storage, and microelectrode applications.

BRIEF DESCRIPTION OF THE DRAWINGS

FIG. 5B is an enlarged view of FIG. 5A along a peeled edge to show carbon nanotube diameters, length, straightness, and uniformity.

FIG. 6A illustrates the effects of $NH_3$ plasma etching for 3 minutes. FIG. 6B illustrates the effects of $N_2$ plasma etching for 3 minutes. FIG. 6C shows an as-sputtered smooth catalyst surface.

FIG. 7B is an enlarged view of FIG. 7A to show carbon nanotube diameters and distributions.

FIGS. 9A–B are scanned images showing the interior and wall structures of a typical thin carbon nanotubes, wherein FIG. 9A is a cross-section view and FIG. 9B is a plan view.

FIGS. 18A–F are a series of scanned images displaying various viewing angles of carbon nanotube obelisks grown from a patterned array of catalyst nano-dots. FIG. 18A is a perspective view of a plurality of patterned arrays. FIG. 18B is a top view of the patterned arrays of FIG. 18A at a reduced magnification. FIG. 18C is a perspective view of one patterned array. FIG. 18D is a top view of one patterned array. FIG. 18E is a perspective view at an increased magnification of the patterned array of FIG. 18C. FIG. 18F is a perspective view of spaced-apart carbon nanotube obelisks.

DETAILED DESCRIPTION OF THE INVENTION

Figure 1A:
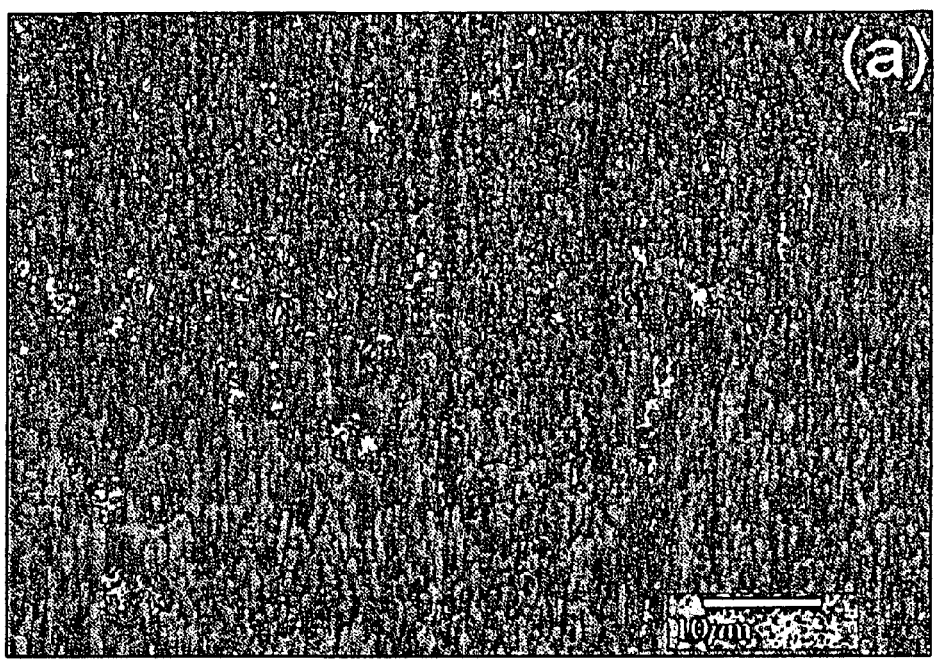
FIGS. 1A–B are scanned images showing alignment of carbon nanotubes grown on a large-area of polycrystalline Ni substrates.

The present invention relates to a product which includes a substrate and one or more hollow core carbon nanotubes originating from a surface of the substrate. When the product has more than one carbon nanotube, the carbon nanotubes are well-aligned and may lie on or extend either perpendicularly or non-perpendicularly from the substrate surface. Embodiments of the product of the present invention include the substrate and either (1) a plurality of substantially aligned carbon nanotubes of a density greater than $10^4$ nanotubes per square millimeter of substrate, (2) a plurality of substantially aligned carbon nanotubes of a density no greater than $10^2$ nanotubes per square millimeter of a substrate, (3) one or more carbon nanotubes, wherein the substrate has a strain point or melting point temperature between about 300° C. and 700° C., (4) a plurality of substantially aligned carbon nanotubes originating and extending outwardly from the substrate outer surface, or (5)

one or more free-standing carbon nanotubes originating and extending outwardly from the substrate outer surface.

As shown in FIGS. 1–19, carbon nanotubes of the present invention are substantially concentric tubules. The nanotubes have diameters ranging from 4 to 500 nm and lengths up to 50 $\mu$m. Preferably, carbon nanotubes which are longer than 20 $\mu$m have a diameter of at least 50 nm to maintain alignment. Depending upon growth conditions, the carbon nanotubes can be either free-standing nanotube obelisks which have a sharp, tapered carbon tip or a large array of well-aligned nanotubes which have a cap distally located from the substrate. The large arrays of carbon nanotubes have densities of $10^6$ to $10^8$ nanotubes per square millimeter of substrate. The cap comprises a catalyst metal or metal alloy material of iron, cobalt, nickel, or an alloy of iron, cobalt, or nickel. The catalyst material and its role is discussed further below. In an embodiment of the present invention, the tips and caps are removed to reveal open-ended carbon nanotubes.

It is contemplated that a wide variety of electrically or non-electrically conductive substrates can be utilized with the present invention. For example, suitable substrates include glass, silica, quartz, silicon, platinum, iron, cobalt, nickel, an alloy of iron, cobalt, or nickel, a ceramic, or a combination thereof. Particularly useful substrates are glass panels and silicon wafers. It is important to recognize that the most important property of the substrate is that the substrate strain point and/or melting point temperatures are above the temperature of carbon nanotube growth. With the present invention, the substrate must have strain point and/or melting point temperatures of at least about 300° C. As disclosed in Li, substrates utilized in the prior art must have strain point and/or melting point temperatures in excess of 700° C. Accordingly, a product of the present invention and the substrate therein have a strain point or melting point temperature between 300° C. and 700° C. Such substrates include flat panel display glass substrates, which have strain point and/or melting point temperatures of 666° C. and below, may be utilized. Certain ceramics, such as $LaAlO_3$, $Al_2O_3$, and $ZrO_2$, YSZ, and $SrTiO_3$ have melting point temperatures of about 3000° C. and are useful as substrates utilized in high temperature environments.

In the present invention, carbon nanotubes are uniquely grown on a surface of a substrate by providing the substrate in a reduced pressure environment containing a carbon source gas and a catalyst gas and exposing the substrate to a plasma under conditions effective to cause formation and growth of one or more carbon nanotubes on the substrate. This is defined as plasma-enhanced hot filament chemical vapor deposition (PE-HF-CVD). Accordingly, the present invention is also directed to products which have carbon nanotubes originating and extending outwardly from an outer surface of the substrate.

Prior to growing the carbon nanotubes by PE-HF-CVD, the substrates are placed into a deposition chamber at a reduced pressure ($<6\times10^{-6}$ Torr) and coated with the catalyst metal or metal alloys discussed above. Either a metal catalyst film of at least about 15 nm thick or one or more metal catalyst nano-dots of about 150 Å thick is deposited onto the substrate. The catalyst film is deposited by radio frequency magnetron sputtering. The catalyst nano-dots are deposited by electron beam evaporation, thermal evaporation, or magnetron sputtering. Surprisingly, the resultingly grown carbon nanotube diameters are directly related to the thickness of the catalyst film. By varying the thickness of the catalyst film, the diameter of the carbon nanotubes can be controlled. Although nano-dot thickness can have a like effect on resulting nanotube diameter, the thickness is less controlling as the film.

To produce the products of the present invention, the coated substrates are placed into a reduced pressure CVD chamber containing a carbon source gas and a catalyst gas and are then exposed to a plasma under conditions effective to cause formation and growth of one or more carbon nanotubes on the substrate surface. Generally, the CVD chamber has a pressure between about 0.1 to about 100 Torr, preferably about 1 to about 20 Torr. Because carbon nanotube growth is induced by plasma enhanced chemical vapor deposition of the carbon source gas, the heated environment of the CVD chamber can be maintained at a temperature between about 300° C. and about 3000° C. As a result of the low temperature requirement, various substrates having relatively low strain point or melting point temperatures as low as about 300° C. may utilized in the present invention. As indicated above, carbon nanotubes growth may occur at very high temperatures and is only constrained by the melting point temperature of the selected substrate. The upper temperature limit of carbon nanotube growth is estimated to be about 3000° C., which corresponds to the highest known ceramic substrate melting point temperature, as discussed above. The growth time depends on the requirement of nanotube length. Normally, it is between 1–10 minutes, which yields a length of 0.1–20 $\mu$m. Growth durations can extend up to 5 hours depending on the desired carbon nanotube lengths.

The carbon source and catalyst gases flow through the CVD chamber with a volume ratio of carbon source gas to catalyst gas ranging from 1:2 to 1:10 at a maintained pressure between about 0.1 to about 100 Torr at a temperature between about 300° C. to 3000° C. The carbon source gas may be selected from saturated or unsaturated linear, branched, or cyclic carbon and hydrogen compounds having up to six carbon atoms which are gases at the deposition pressure. For example, very pure (99.99% purity) acetylene, ethylene, and benzene, preferably acetylene, may be utilized as the carbon source gas of the present invention. The catalyst gas is ammonia (99.99% purity) at CVD temperatures below 700° C. At CVD temperatures above 700° C., the catalyst gas may be ammonia, nitrogen (99.99% purity), or a combination thereof. Ammonia is the preferred catalyst gas of the present invention. Preferably, the carbon source and catalyst gases are introduced into the CVD chamber simultaneously or the catalyst gas is introduced prior to the carbon source gas.

Carbon nanotubes are synthesized with the diameter, length, site density, and growing angle controlled. Plasma intensity may be varied to determine the nanotube aspect ratios for diameter and length, and range of both site and height distributions. Vertical or non-vertical growth of the carbon nanotubes is independent of the substrate surface topography and can be controlled by the angle placement of the substrate in the CVD chamber with respect to the orientation of the electric field of the plasma generator.

These lower temperature growth conditions are suitable for electron emission applications, such as cold-cathode flat panel displays which require the carbon nanotube emitters to be grown substantially perpendicular to a glass substrate surface. However, carbon nanotubes grown at the lower temperatures have more wall defects or discontinuations. These discontinuations provide a diffusion path to the nanotube core. Should there be a desire to manufacture carbon nanotubes with limited defects, higher growth temperatures may be utilized.

The growth mechanism of aligned carbon nanotubes is ascribed in the literature to be a constraint of either the pores in mesoporous silica or the laser etched tracks in silica. In the present invention, the alignment of the carbon nanotubes cannot be due to pores or etched tracks since there are no pores or etched tracks in the glass substrates, as shown in FIGS. 5A–B, 10, 15, 17A–B, and 18C, E, and F. Rather, alignment is due to a nanotube nucleation process catalyzed by the catalyst gas (e.g., ammonia) and the catalyst layer or nano-dot (e.g., nickel). In the presence of the catalyst gas, each metal catalyst cap efficiently catalyzes the continuous synthesis of carbon nanotubes. With the growth of the carbon nanotubes, the cap is maintained at the distal end of each carbon nanotube. The alignment and thickness of the carbon nanotubes may be determined by the orientation and size respectively of the initial catalytic centers. If desired, the catalyst metal caps can be removed by subjecting the carbon nanotubes to either $HNO_3$ solution etching or Ar ion sputtering to open the distal ends.

In some applications, a single carbon nanotube or patterns with controlled site density is desired, which can be accomplished by selective deposition of the catalyst nano-dots. In the present invention, the carbon nanotubes grown from the metal catalyst nano-dots are obelisks which have tapered, sharp carbon tips and have rounded base diameters approximately the same as the nano-dots. The nanotube height depends on the growth time and nano-dot thickness. The tips can be removed as well to provide an open ended nanotube by placing the nanotubes in a reaction chamber and exposing the nanotubes to oxygen and heat at about 400° C. for about 0.5 hour.

A filling can be placed within the carbon nanotubes through the open ends or through the structural discontinuations. For example, fillings such as hydrogen, lithium ions, bismuth, lead telluride, bismuth tritelluride, or a pharmacological agent, to name only a few, may be inserted into the nanotube core by electrochemical or physical methods. If desired, the open ends of the carbon nanotubes can be enclosed or sealed by magnetron sputtering or electrochemical deposition of an enclosing material, such as a metal.

Figure 20:
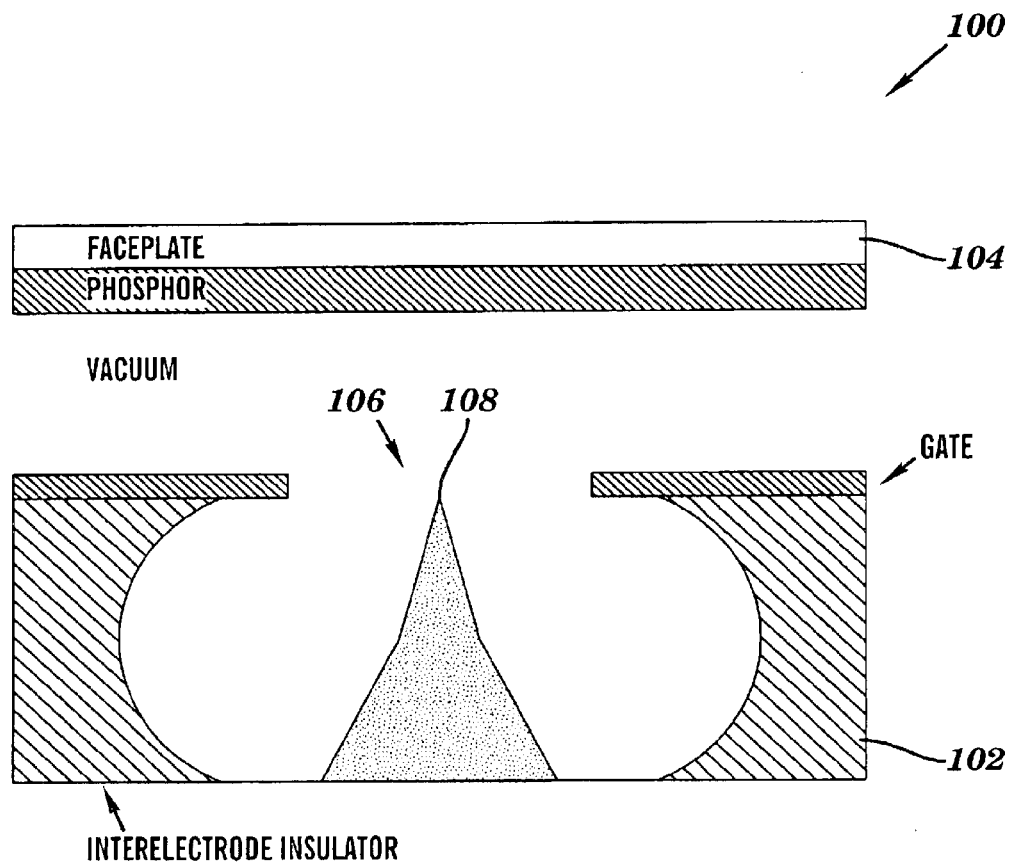
FIG. 20 is a partial, top view of a field emission display apparatus of the present invention.

Now, referring to FIG. 20, a conventional flat panel display or field emission display 100 has a baseplate 102, a spaced-apart phosphor coated faceplate 104, and an electron emitter array 106 positioned on the baseplate 102 for emitting electrons to impinge upon and thereby illuminate the phosphor coating. The baseplate 102, the faceplate 104 and the emitter array 106 are disposed in a vacuum environment. The emitter 106, which is operably connected to an electron generating source, has a sharp tip 108, known as a Spindt tip, to emit electrons. However, these emitters 106 have certain drawbacks because they have a relatively short wear life, have a low emission density due to the limits of existing lithography technology, and are relatively expensive. Products of the present invention comprising large arrays of well-aligned carbon nanotubes as shown in, for example, FIGS. 1, 2, 5, 7, 10, 11, and 18B, can be used to replace the base plate/emitter array combination 102 and 106. Since the carbon nanotubes can be produced highly aligned and perpendicular to the substrate, field emission displays can be fabricated utilizing such arrays as emitters. Further, as discussed in Schmid et al., "Carbon Nanotubes Are Coherent Electron Sources," *Appl. Phys. Lett.*, 70(20):2679-2680 (1997)("Schmid"), Collins et al., "A Simple And Robust Electron Beam Source From Carbon Nanotubes," *Appl. Phys. Lett.*, 69(13): 1969–1971 (1996), and Rinzler et al., Unraveling Nanotubes: "Field Emission From an Atomic Wire," *Science*, 269: 1550–1553 (1995) ("Rinzler"), all of which incorporated herein by reference, carbon nanotubes emit electrons in the same manner as the Spindt tips upon operable connection to an electron generating source. Not only can the carbon nanotubes increase emitter wear life, contrast and brightness are improved as well due to the large nanotube density.

Figure 19:
FIG. 19 is a scanned image showing an elevation view of a carbon nanotube obelisk.
Figure 21:
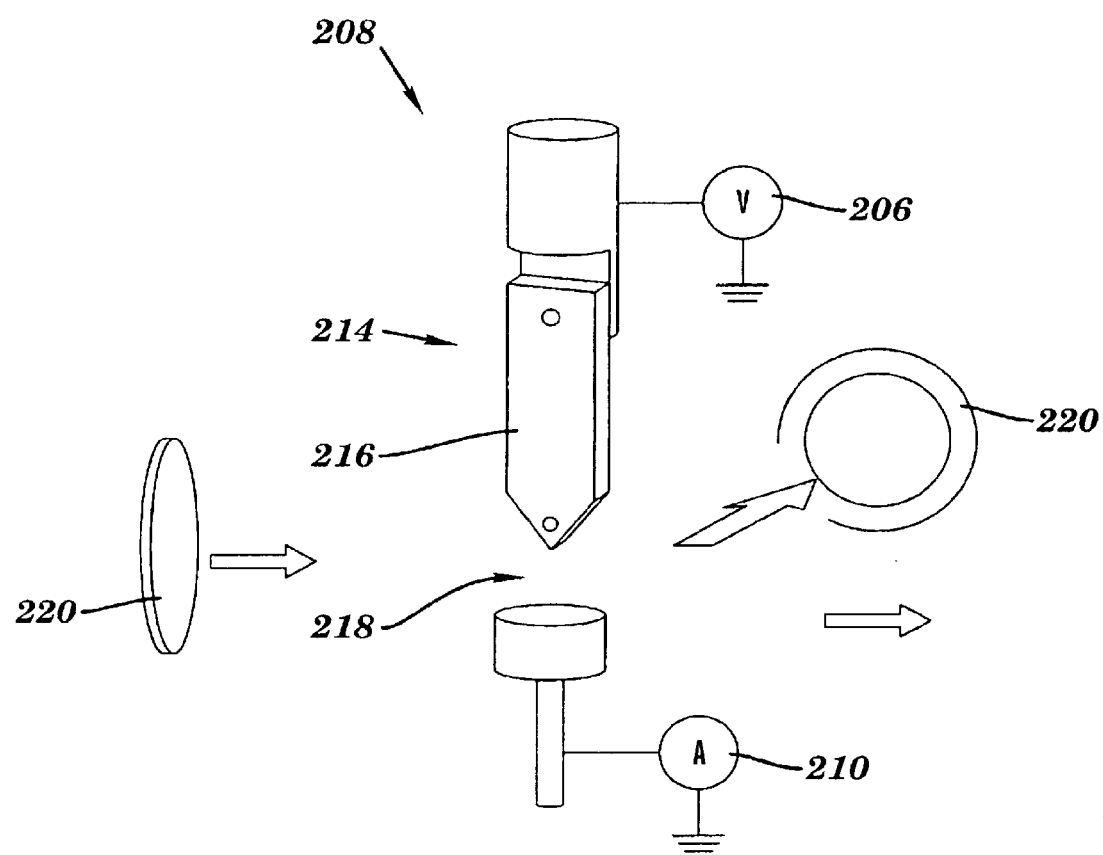
FIG. 21 is a perspective view of a probe for a scanning electron microscope of the present invention.
Figure 22:
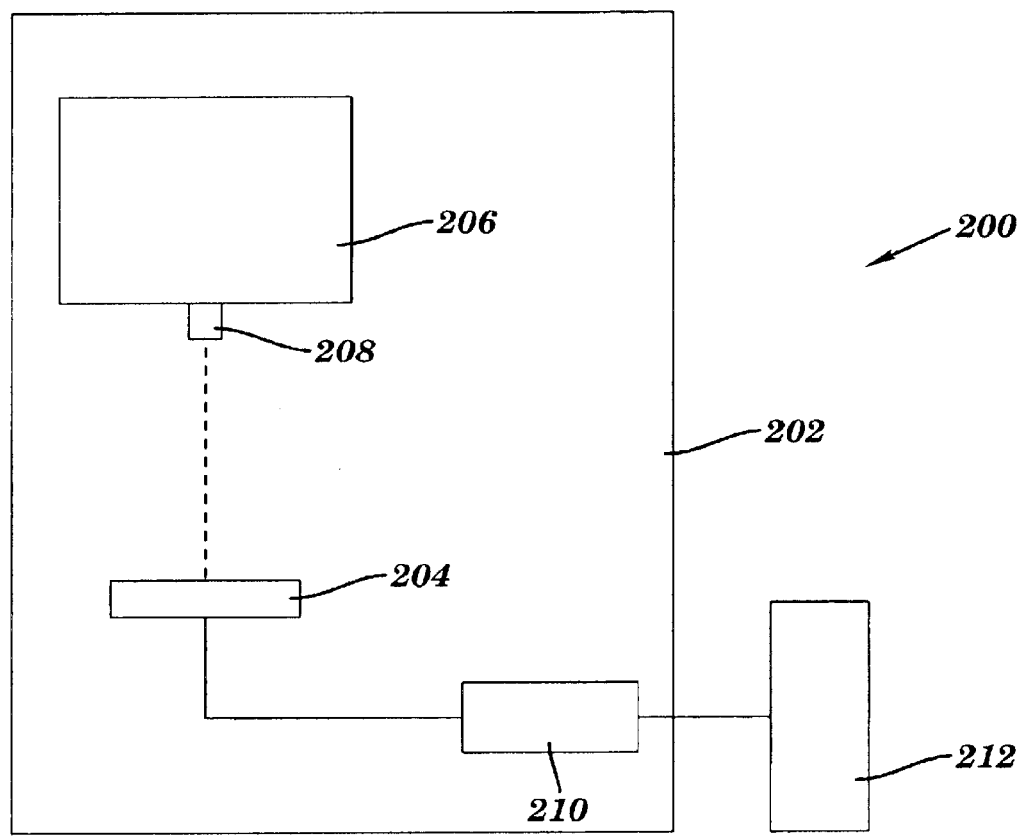
FIG. 22 is a schematic illustrating an example of a scanning electron microscope of the present invention.

Referring to FIGS. 19, 21, and 22, and generally to FIGS. 1–18, the products of the present invention can be utilized as a probe for a scanning electron microscope, as indicated in Rinzler. A scanning electron microscope 200 of the present invention comprises a vacuum chamber 202 capable of receiving a specimen 204, an electron source 206 for producing electrons, a probe 208 which is operably positioned within the vacuum chamber 202 for emitting and directing the electrons toward and scanning the specimen 204, a detector 210 operably positioned within the vacuum chamber 202 for collecting radiation issuing from the specimen 204 as a result of scanning by the probe 208 to produce an output signal, and a display screen 212 operably connected to the detector 210 to receive the output signal and resulting display an image of the area of the specimen 204 scanned by the probe 208. Referring to FIGS. 1–5B, 7–19 and 21, the probe 208 is a product of the present invention having a substrate and either (1) a plurality of substantially aligned carbon nanotubes of a density greater than $10^4$ nanotubes per square millimeter of substrate; (2) a plurality of substantially aligned carbon nanotubes of a density no greater than $10^2$ nanotubes per square millimeter of a substrate; (3) one or more carbon nanotubes, wherein the substrate has a strain point or melting point temperature between about 300° C. and 700° C.; (4) a plurality of substantially aligned carbon nanotubes originating and extending outwardly from an outer surface of the substrate; or (5) one or more free-standing carbon nanotubes originating and extending outwardly from an outer surface of the substrate. Preferably, the probe 208 is a product of the present invention comprising a substrate 214 having an outer surface 216 and one free-standing carbon nanotube 218 originating and extending from the outer surface 216 of the substrate 214.

Selective positioning and growth of a single, free-standing carbon nanotube from a single, catalyst nano-dot in accordance with the method of the present invention as previously described can produce the probe 208. Referring to FIG. 21, and generally to FIG. 19, a single, free-standing carbon nanotube 218 originating and extending from an outer surface 216 of a substrate 214 is operably connected to the electron source 206. The substrate 214 is selected from an electrically conductive material, which is connectable to the electron source.

In operation, the specimen 204 is positioned within the vacuum chamber 202, and the chamber 202 is evacuated. The microscope 200 scans the specimen 204 with a fine probe of electrons emitting from the probe 208. The electrons are produced from the electron source 206, which can be a field-emission electron source (not shown) and suitable accelerating electrodes (not shown), such as an electron gun (not shown). Electrons that are transmitted through the specimen 204 are collected by the detector 210 to provide the output signal. For example, the detector 210 can comprise a phosphor screen (not shown) with a photomultiplier (not shown) for detecting light from the screen. This output signal is used to modulate the beam of the display screen 212, such as a cathode ray tube, which is scanned in synchronism with the probe 208, so as to cause the display screen 212 to display a pattern which depends on the structure of the scanned portion of the specimen 204. Alternatively, instead of collecting transmitted electrons, secondary radiation (e.g., electrons or x-rays), emitted from the specimen 204 as a result of bombardment by the electrons of the probe 208, may be detected to provide the output signal.

In such a microscope, the electron fine probe or carbon nanotube 218 must be very fine, such as to illuminate only a small region of the specimen 204, in order to enable small features of the specimen 204 to be examined. Production of a fine probe of electrons requires an electron source 206 having a very small electron-emitting area such as, for example, a field-emission electron source. Magnets 220 can be operably disposed in the vacuum chamber 202 to focus or alter the emitted electron probe. Carbon nanotubes produced in accordance with the present invention are such electron emitters.

Figure 23:
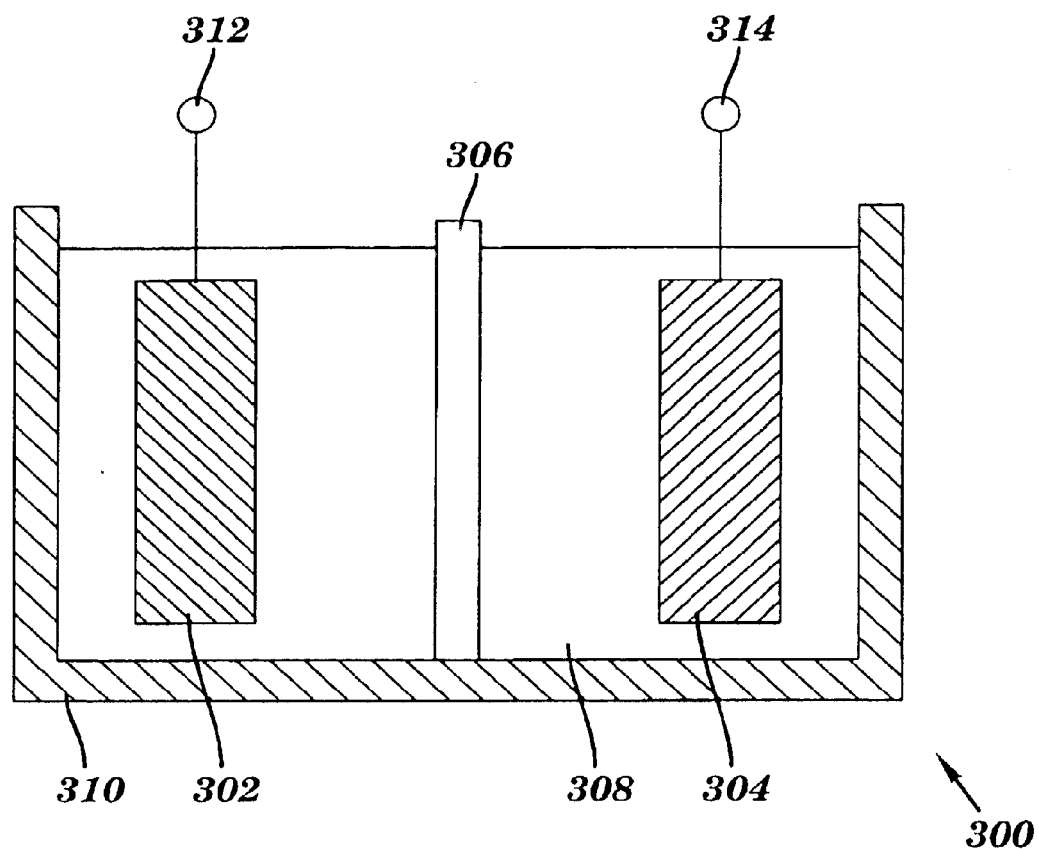
FIG. 23 is a schematic drawing illustrating an example of the basic construction of a battery of the present invention.

The products of the present invention can also be utilized to form alkali metal ion batteries, such as, lithium batteries. As shown in FIG. 23, the battery 300 comprises an anode 302, a cathode 304, an insulator 306 disposed between the anode 302 and the cathode 304, and an electrolyte 308. At least one of the anode 302 and the cathode 304, preferably both, comprise a product of the present invention having a substrate and either (1) a plurality of substantially aligned carbon nanotubes of a density greater than $10^4$ nanotubes per square millimeter of substrate; (2) a plurality of substantially aligned carbon nanotubes of a density no greater than $10^2$ nanotubes per square millimeter of a substrate; (3) one or more carbon nanotubes, wherein the substrate has a strain point or melting point temperature between about 300° C. and 700° C.; (4) a plurality of substantially aligned carbon nanotubes originating and extending outwardly from an outer surface of the substrate; or (5) one or more freestanding carbon nanotubes originating and extending outwardly from an outer surface of the substrate. Preferably, the product has a plurality of substantially aligned carbon nanotubes of a density greater than $10^4$ nanotubes per square millimeter of substrate.

Here, the substrate comprises an electrically conductive material, and the carbon nanotubes have at least one diffusion path to the hollow core of the nanotubes. As reported in Gao et al, "Electrochemcial Intercalation of Single-walled Carbon Nanotubes with Lithium," *Chem. Phys. Lett.*, (in press) ("Gao") alkali metals can be electrochemically intercalated into the hollow cores of carbon nanotubes. Gao also reports that lithium can be reversibly intercalated from the nanotubes in the range of 100–400 mAh/g. In the present invention, lithium ions may be intercalated into the carbon nanotubes of the anode 302 by charging the battery 300.

Figure 13:
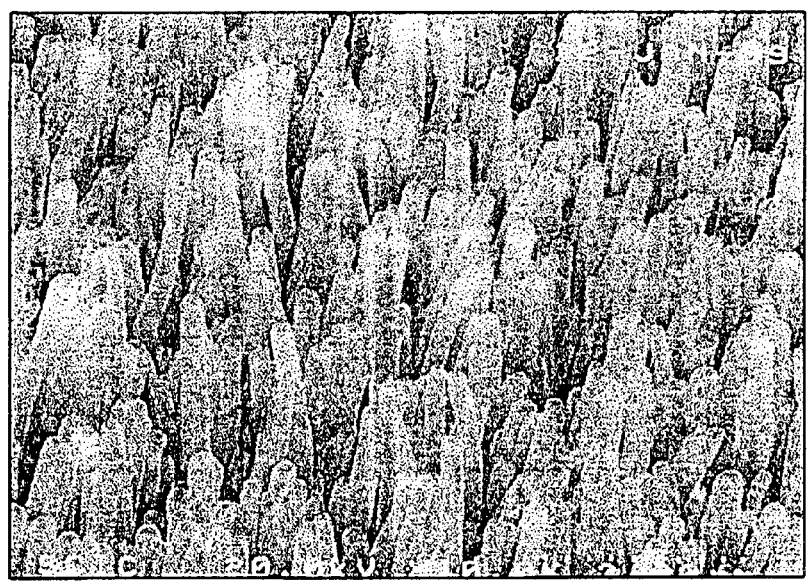
FIG. 13 is a scanned image showing open ended carbon nanotubes etched by $HNO_3$ for 1 minute.

Although not required, the carbon nanotubes of the product may have open ends to provide the metal diffusion path, as shown in FIG. 13. Preferably, the carbon nanotubes have high structural defect or discontinuation densities in the walls. As previously discussed, carbon nanotubes grown at low growth temperatures (e.g., 300° C. to 400° C.) by PE-HF-CVD have such structural discontinuations. These structural discontinuations provide high active surface areas and numerous diffusion paths to the nanotube core for metal diffusion. It is not necessary for the carbon nanotubes having discontinuations to be open-ended, since most metal diffusion occurs through the discontinuations.

In the present invention, the cathode 304 functions to assist conduction for collecting current, and the anode 302 functions as the host material for the lithium ions. Since the anode 302 and/or the cathode 304 comprises well-aligned carbon nanotubes, the electrolyte 308 easily permeates the nanotubes, which act as electrodes. As a result, impedance of the battery 300 is decreased, the charge-discharge efficiency is improved over conventional batteries, and secondary reactions during charge and discharge are prevented. Thus, the battery 300 of the present invention has a high capacity and a long life cycle.

When the cathode 304 comprises the product of the present invention having intercalated lithium ions, a higher collecting ability can be attained. As a result, the utilization of the cathode 304 can be increased to produce a high-capacity lithium battery 300.

Products of the present invention having carbon nanotubes substantially aligned and oriented substantially perpendicular with respect to the substrate are preferred. By utilizing such products, the electrolyte 308 can permeate the nanotubes much easier. This results in the battery 300 being capable of rapid charge and discharge. In the anode 302, lithium can be deposited on the carbon nanotubes surfaces and intercalated into the nanotubes, thereby preventing the growth of dendritic lithium metal deposition and resulting in the battery 300 having a higher capacity. Also, when the products of the present invention are used as an anode 302 for intercalating and deintercalating lithium ions, a high-capacity anode 302 is formed.

Again referring to FIG. 23, the anode 302 and the cathode 304 are disposed in the electrolyte 308 held in a housing 310 opposite to each other through the insulator 306. The insulator 306 is provided for preventing internal shorts due to contact between the anode 302 and the cathode 304. The anode 302 and the cathode 304 respectively can comprise the products shown in FIGS. 1–19. An anode terminal 312 and a cathode terminal 314 are electrically connected to the respective product substrates comprising the anode 302 and the cathode 304. The anode terminal 312 and the cathode terminal 314 may be utilized for at least a portion of the housing 310. When a lithium battery 300 of the present invention is assembled, the anode 302 and cathode 304 must be sufficiently dehydrated and dried. For example, dehydration can be performed by heating under reduced pressure.

The carbon nanotubes serve as the collecting electrodes of the anode 302 and the cathode 304. The nanotubes function to efficiently supply a current to be consumed by electrode reaction during charge and discharge or to collect the current generated by the electrode reaction.

The insulator 306 functions to prevent internal shorts between the anode 302 and the cathode 304, and can function to hold the electrolyte 308. The insulator 306 must have pores which permit movement of lithium ions, and must be insoluble and stable in the electrolyte 306. Thus, examples of materials which may be used for the insulator 306 include glass, polyolefins, such as polypropylene and polyethylene, fluororesins, and materials having a micropore and nonwoven fabric structure. A metal oxide film having micropores and a resin film compounded with a metal oxide can also be used.

An electrolyte solution is prepared by dissolving the electrolyte 308 in a solvent. Examples of electrolytes 308 include acids, such as $H_2SO_4$, HCl, and $HNO_3$, salts comprising lithium ions and Lewis acid ions ($BF_4^-$, $PF_6^-$, $ClO_4^-$, $CF_3SO_3^-$, and $BPh_4^-$), and salt mixtures thereof. Salts comprising cations such as sodium ion, calcium ion, and tetraalkylammonium ion, and the Lewis acid ions can also be used. These salts can be sufficiently dehydrated and deoxidized by heating under reduced pressure.

Examples of solvents which are useful for the electrolyte 308 include acetonitrile, benzonitrile, propylenecarbonate, ethylenecarbonate, dimethylcarbonate, diethylcarbonate, dimethylformamide, tetrahydrofuran, nitrobenzene, dichloroethane, diethoxyethane, 1,2-dimethoxyethane, chlorobenzene, gamma-butyrolactone, dioxolan, sulfolan, nitromethane, 2-methyltetrahydrofuran, 3-propylsydnone, sulfurdioxide, phosphorylchloride, thionylchloride, sulfurylchloride, and solvent mixtures thereof. These solvents can be dehydrated by activated alumina, molecular sieves, phosphorus pentaoxide, or calcium chloride. Some of the solvents are also subjected to removal of impurities and dehydrated by distillation in coexistence with an alkali metal in an inert gas.

To prevent electrolyte 308 leakage, the electrolyte 308 can be formed into a gel. Polymers which absorb the solvent of the electrolyte 308 and swell may be used as a gelling agent. For example, such polymers include poly(ethyleneoxide), poly(vinylalcohol), polyacrylamide, and the like.

The products of the present invention may be utilized to form fuel cells. A fuel cell is a device for directly converting the chemical energy of a fuel into electrical energy. There are various constructions of fuel cell devices, such as fuel cells, fuel cell groups or stacks, and fuel cell power plants which use hydrogen as the fuel for the respective fuel cell device. As is well known, an exothermic chemical reaction takes place in these fuel cell devices between hydrogen and an oxidant, for example, oxygen, resulting in the formation of water as the reaction product and the desired generation of electricity. The incidental release of thermal energy exhibited as sensible heat is typically removed from the fuel cell. During the above reaction, hydrogen and the oxidant are consumed by the fuel cell. For the fuel cell device to continue its operation, hydrogen and the oxidant must be replenished at their respective consumption rates.

In some fuel cell applications, hydrogen is stored in tanks or similar containers in its liquid or gaseous state in its pure form or in combination with inert substances. However, such containers are generally relatively large and heavy, and problematic when storage space and/or payload weight are limited. Thus, there is an advantage when large amounts gaseous hydrogen can be stored in compact, relatively light weight containers.

Figure 24:
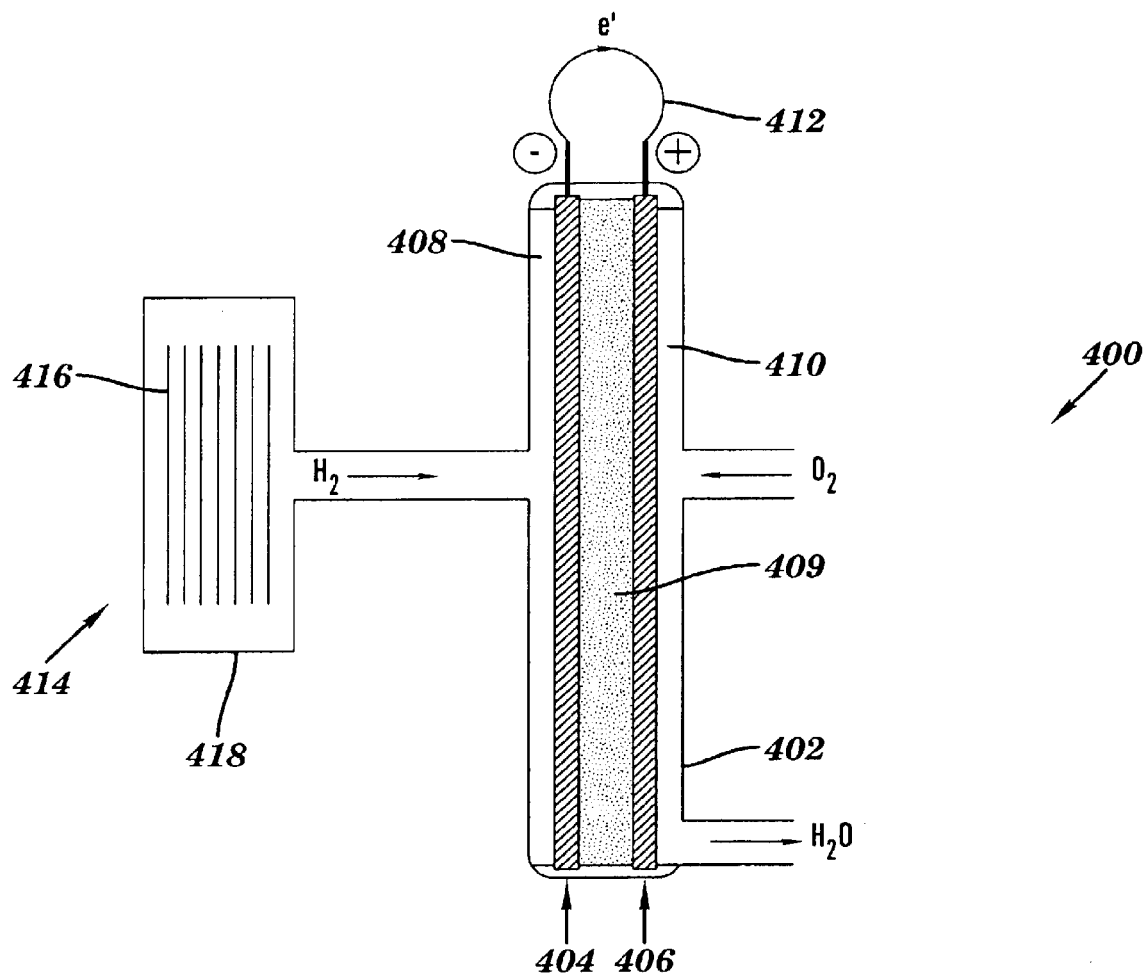
FIG. 24 is a schematic drawing illustrating a fuel cell of the present invention.

Referring to FIG. 24, a fuel cell 400 of the present invention comprises a housing 402, two gas diffusion electrodes, an anode 404 and a cathode 406, positioned within the housing 402 and respectively forming an anode side 408 and a cathode side 410, an electrolyte impregnated matrix or ion exchange membrane 409 positioned between and in electrical contact with the electrodes 404 and 406, an external circuit 412 electrically and operably connecting the anode 404 to the cathode 406 and a hydrogen storage unit 414 comprising products 416 of the present invention positioned within an enclosure 418 which is operably connected to the anode side 408. A catalyst layer is disposed on the electrolyte-facing surfaces of the respective electrodes 404 and 406. In the operation of the fuel cell 400, hydrogen gas is fed to the back side of the anode 404, and oxygen gas is fed to the back side of the cathode 406. The respective gases diffuse through the electrodes 404 and 406 and react at the catalyst sites to yield electrical energy, heat, and moisture.

On the anode side 408 of the fuel cell 400, hydrogen is electrochemically oxidized to give up electrons in accordance with the reaction: $2H_2 \rightarrow 4H^+ + 4e^-$. The electrical current so generated is conducted from the anode 404 through the external circuit 412 to the cathode 406. On the cathode side 410 of the fuel cell 400, the electrons are electrochemically combined with the oxidant in accordance with the reaction: $O_2 + 4H^+ + 4e^- \rightarrow 2H_2O$. The related flow of electrons through the electrolyte completes the circuit.

Referring additionally to FIGS. 1–19, the hydrogen storage unit 414 comprises the enclosure 418 and products 416 of the present invention having a substrate and either (1) a plurality of substantially aligned carbon nanotubes of a density greater than $10^4$ nanotubes per square millimeter of substrate; (2) a plurality of substantially aligned carbon nanotubes of a density no greater than $10^2$ nanotubes per square millimeter of a substrate; (3) one or more carbon nanotubes, wherein the substrate has a strain point or melting point temperature between about 300° C. and 700° C.; (4) a plurality of substantially aligned carbon nanotubes originating and extending outwardly from an outer surface of the substrate; or (5) one or more free-standing carbon nanotubes originating and extending outwardly from an outer surface of the substrate. The carbon nanotubes have a hollow core and at least one diffusion path into the core. Preferably, the product 416 has plurality of substantially aligned carbon nanotubes of a density greater than $10^4$ nanotubes per square millimeter of substrate with a high discontinuation density in the nanotube structure to provide a plurality of diffusion paths. Further, the carbon nanotubes of this product 416 can have an open end distal from the substrate. Particularly useful are single-walled carbon nanotubes of the present invention which have a diameter of 1 nm. These nanotubes form bundles and are strong hydrogen gas absorbers. Hydrogen can be introduced into the carbon nanotube hollow core by placing the product 416 in a high pressure chamber (not shown) and introducing hydrogen gas at relatively high pressures into the chamber to diffuse hydrogen across the diffusion paths into the carbon nanotubes. Also, hydrogen can be diffused into the nanotubes electropotentially or electrochemically. Further, heated products 416 can be placed into a hydrogen rich environment and allowed to cool, thereby drawing hydrogen into the nanotubes. Because the light-weight carbon nanotubes of the present invention have relatively large cores and surface areas, large amounts of hydrogen can be stored therein.

The products of the present invention can also be utilized to form composites with other dissimilar materials. Suitable dissimilar materials include metals, ceramics, glasses, polymers, graphite, and mixtures thereof. Such composites are prepared by coating the products of the present invention with these dissimilar materials in solid particulate form or in liquid form.

A variety of polymers, including thermoplastics and resins, can be utilized to form composites with the products of the present invention. Such polymers include, for example, polyamides, polyesters, polyethers, polyphenylenes, polysulfones, polyurethanes, or epoxy resins.

In another embodiment, the composite contains an inorganic material, e.g., a ceramic material or a glass. For example, a high-temperature copper oxide superconductor ceramic materials, such as BiSrCaCuO (BSCCO), TlBaCaCuO (TBCCO), $Bi_2Sr_2CaCu_2O_8$ (Bi-2212), $Bi_2Sr_2Ca_2Cu_3O_{10}$ (Bi-2223), $Tl_2Ba_2CaCuCO_6$ (Tl-2201), $Tl_2Ba_2CaCu_2O_8$ (Tl-2212), $Tl_2Ba_2Ca_2Cu_3O_{10}$ (Tl-2223), $TlBa_2CaCu_2O_7$ (1212), $TlBa_2Ca_2Cu_3O_9$ (Tl-1223), and any ceramic composition derived from these compositions, such as partial replacement of Tl by Bi, Pb, Bi, or Pb, Ba by Sr, and Ca by Y or Cr., are useful in the present invention. These ceramics are deposited on the products of the present invention by magnetron sputtering, laser ablation, thermal spraying, electron beam evaporation, etc. to coat the substantially perpendicular, aligned carbon nanotubes an form a high temperature superconducting material. Due to the high degree of nanotube alignment, excellent magnetic flux line core-pinning interaction can be obtained to enhance critical current densities ($J_c$) without destroying an unnecessary volume fraction of the superconductor.

As discussed in Yang et al., "Nanorod-Superconductor Composites: A Pathway to Materials with High Critical Current Densities," *Science*, 273: 1836–1840 (1996), incorporated herein by reference, large-scale applications of the high-temperature copper oxide superconductor ("HTSC") materials listed above require high $J_c$ at temperatures near the boiling point of liquid nitrogen to be technologically useful. By inserting columnar defects into the HTSC materials, high $J_c$ can be maintained at higher temperatures when subjected to an electric current. The columnar defects can be accomplished by coating products of the present invention with the HTSC materials. Accordingly, a high temperature superconductor comprises a product having a substantially non-electrically conductive substrate and either (1) a plurality of substantially aligned carbon nanotubes of a density greater than $10^4$ nanotubes per square millimeter of substrate; (2) a plurality of substantially aligned carbon nanotubes of a density no greater than $10^2$ nanotubes per square millimeter of a substrate; (3) one or more carbon nanotubes, wherein the substrate has a strain point or melting point temperature between about 300° C. and 700° C.; (4) a plurality of substantially aligned carbon nanotubes originating and extending outwardly from an outer surface of the substrate; or (5) one or more free-standing carbon nanotubes originating and extending outwardly from an outer surface of the substrate, a high-temperature copper oxide superconductor material in admixture with the product, and at least two spaced apart terminals connectable to an electric circuit, whereby the product and the high-temperature copper oxide superconductor material admixture are subjectable to an electric current.

In still another embodiment, the composite includes a metal. Suitable metals include aluminum, magnesium, lead, zinc, copper, tungsten, titanium, niobium, hafnium, vanadium, and alloys thereof.

Figure 25:
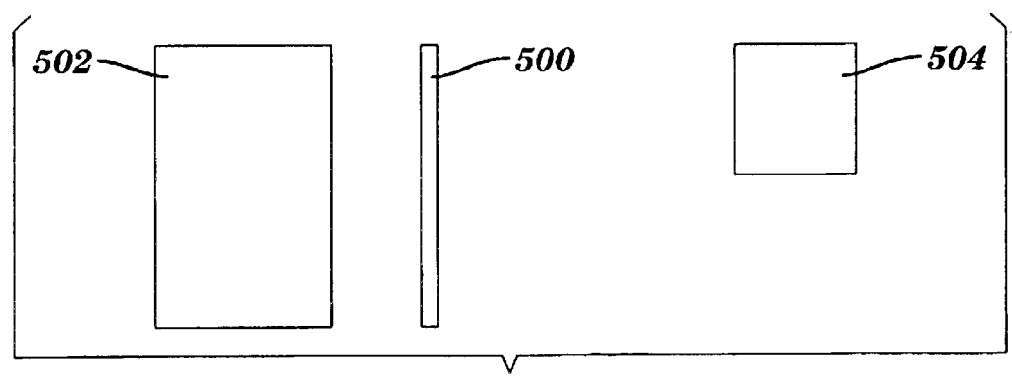
FIG. 25 is a schematic drawing illustrating an electromagnetic interference shield disposed between an electromagnetic interference source and an electronic component.

Referring to FIG. 25 and generally to FIGS. 1–5B and 7–19, an electromagnetic interference (EMI) shield 500 is formed from a product of the present invention comprising a substrate and either (1) a plurality of substantially aligned carbon nanotubes of a density greater than $10^4$ nanotubes per square millimeter of substrate; (2) a plurality of substantially aligned carbon nanotubes of a density no greater than $10^2$ nanotubes per square millimeter of a substrate; (3) one or more carbon nanotubes, wherein the substrate has a strain point or melting point temperature between about 300° C. and 700° C.; (4) a plurality of substantially aligned carbon nanotubes originating and extending outwardly from an outer surface of the substrate; or (5) one or more free-standing carbon nanotubes originating and extending outwardly from an outer surface of the substrate and a dissimilar material in admixture with the product. The dissimilar material comprises a polymer, graphite, or a combination thereof. Such polymers are thermoplastics and resins and can include, for example, polyamides, polyesters, polyethers, polyphenylenes, polysulfones, polyurethanes, or epoxy resins. The electromagnetic interference shield 500 is operationally positioned with respect to either an electromagnetic source 502 or an electronic component 504.

The composite can be used as an EMI shielding material in the construction of gaskets, housings for electronic components, including components within computers, conducting cables, and shielded rooms, EMI emission sources 502, and other applications known in the art. Depending upon the substrate selected for the product, such an EMI shield 500 is particularly useful in high temperature environments. In a process for shielding an electronic component 504 against EMI produced by the electromagnetic radiation source 502, the EMI shield 500 of the present invention is interposed between the electronic device 504 and the electromagnetic radiation source 502. Interference of the device 504 by the radiation source 502 is thereby substantially reduced or eliminated. A shielded electronic component 504 for resisting EMI generated by the electromagnetic source 502 has an electronic component 504 and a EMI shield 500 of the present invention operatively positioned with respect to the component 504. A shielded electromagnetic emission source 502 has an EMI emitting source 502 and EMI shield 500 of the present invention operatively positioned with respect to the source 502.

Figure 26:
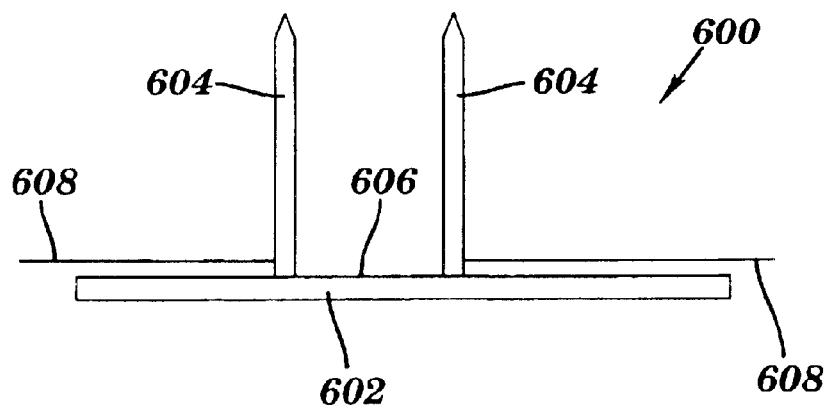
FIG. 26 is a schematic drawing illustrating a microelectrode of the present invention.

Still, the products of the present invention can as well be utilized to form a microelectrode 600, as shown in FIG. 26 and discussed in Stulik et al., "Microelectrodes: Definitions, Characterization and Hints For Their Use," *IUPAC Commission*, 5: Document No. 550/61/97 (1999), incorporated herein by reference. The microelectrode 600 comprises a product having a substantially non-electrically conductive substrate 602 and either (1) a plurality of substantially aligned carbon nanotubes 604 of a density greater than $10^4$ nanotubes per square millimeter of substrate; (2) a plurality of substantially aligned carbon nanotubes 604 of a density no greater than $10^2$ nanotubes per square millimeter of a substrate; (3) one or more carbon nanotubes 604, wherein the substrate 602 has a strain point or melting point temperature between about 300° C. and 700° C.; (4) a plurality of substantially aligned carbon nanotubes 604 originating and extending outwardly from an outer surface of the substrate 602; or (5) one or more free-standing carbon nanotubes 604 originating and extending outwardly from an outer surface 606 of the substrate 602 and at least one electrically conductive microfiber 608 operably connected to at least one carbon nanotube 604 of the product, wherein the at least one carbon nanotube 604 is operably and electrically connectable to an electric circuit.

Particularly well suited for use as an electrode or an array of electrodes are carbon nanotubes having open ends, as shown in FIG. 13. The carbon nanotubes are grown on a non-electrically conductive substrate, such as glass, quartz, or a ceramic. The carbon nanotubes are operably and electrically connectable to an electric circuit with electrically conductive microfibers, such as, platinum or carbon microfibers, attached to the nanotubes.

EXAMPLES

Example 1

Polished polycrystalline and single-crystal Ni substrates were placed into a chemical vapor deposition (CVD) chamber, and the pressure was reduced to $<6 \times 10^{-6}$ Torr. Acetylene gas (99.99% purity) and ammonia gas (99.99% purity) were introduced into the chamber at a total flow rate of 120–200 standard cm³ per minute (sccm) and at a maintained working pressure of 1–20 Torr under the conditions listed in Table 1. After stabilizing the working pressure, a tungsten filament coil powered by a DC source (a 0–500 V DC, 3 A power supply, Advanced Energy MDX 1.5K-magnetron drive) and a plasma-generator were energized to generate heat and plasma at a temperature below 666° C. to induce carbon nanotube growth. Samples of the carbon nanotubes were examined by scanning electron microscopy (SEM, Hitachi S-4000) to measure tube lengths, diameters, site distributions, alignment, density and uniformity. High-resolution transmission electron microscopy (TEM) was used to determine the microstructure of individual tubes. Further, the samples were also examined by x-ray diffraction, Raman spectroscopy, and x-ray photoemission spectroscopy to study the structure, crystallinity, composition, and central core and tube wall structures.

TABLE 1

Growth conditions for the nanotubes shown in FIGS. 1(A), 1(B), 2, and 3.

| $C_2H_2/NH_3$ (sccm/sccm) | Filament Current (amperage, A) | Plasma Intensity (amperage/voltage/ watts) | Growth Time (minutes) |
|---|---|---|---|
| (A): For FIGS. 1(A) and 1(B): | | | |
| 20/100 | 9 | 0.09/460/50 | 90 |
| (B): For FIG. 2: | | | |
| 80/160 | 9 | 0.2/640/140 | 25 |
| (C): For FIG. 3: | | | |
| 40/80 | 6 | 0.3/700/220 | 20 |

Figure 1B:
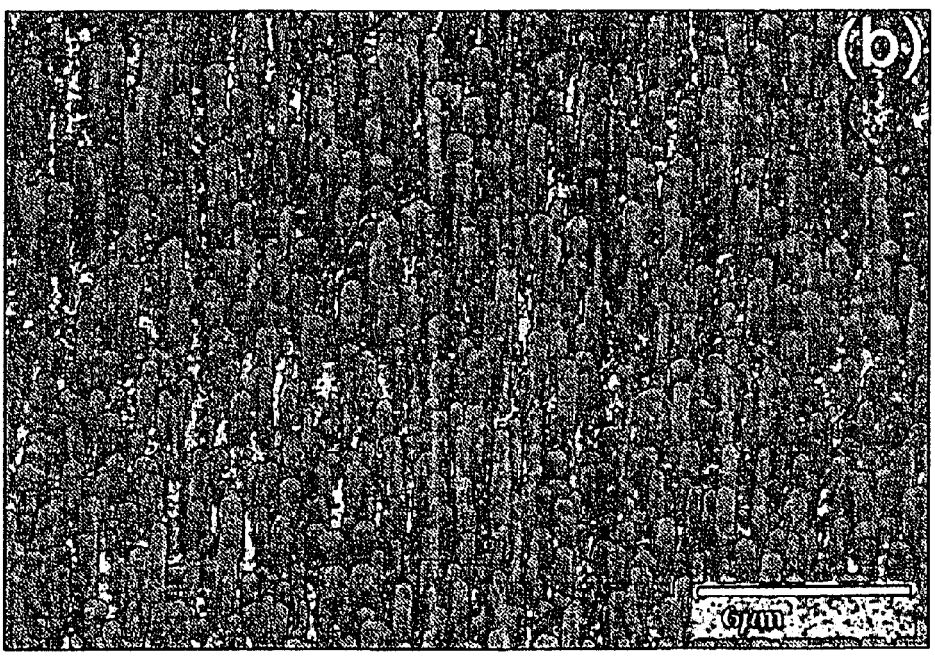

FIG. 1A is a scanned image of an SEM micrograph showing the alignment of carbon nanotubes on polycrystalline nickel grown under the conditions described in Table 1(A). As observed, the carbon nanotubes are oriented perpendicular to the substrate surface and are quite uniform in height. The carbon nanotubes do not grow well along the Ni grain boundaries, shown by the two empty tracks running from upper left and from upper right down to bottom. This is probably due to the fact that grain boundaries do not have enough available nickel as a catalyst. FIG. 1B is a higher magnification image of an area within a single nickel grain. Here, nanotube distribution uniformity within this grain is reasonably good. Although there is a wide distribution of carbon nanotube diameters ranging from 60–500 nm, the uniformity in both diameter and site distributions can be controlled via the growth conditions. Here, carbon nanotube density is about $10^6$ nanotubes/mm$^2$.

Figure 2:
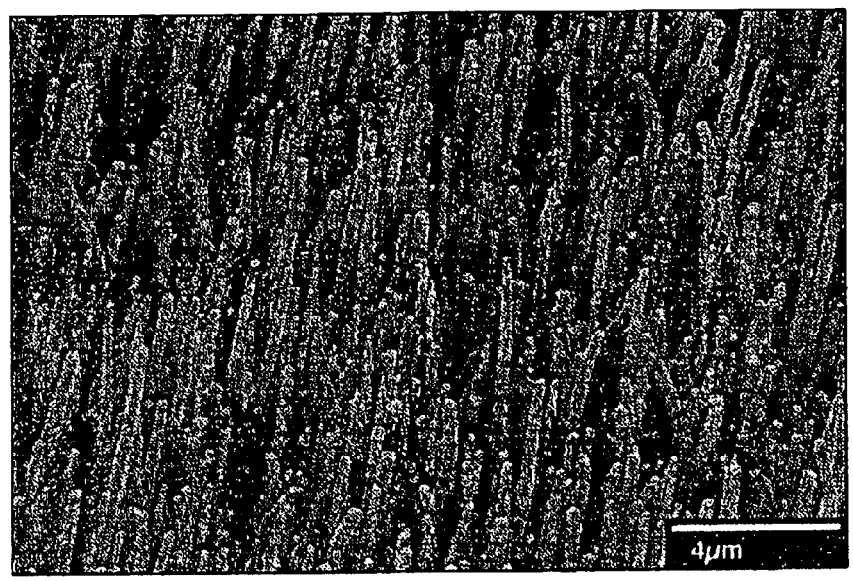
FIG. 2 is a scanned image of a scanning electron microscope micrograph of showing carbon nanotubes grown at a higher plasma intensity under the conditions listed in Table 1(b).

FIG. 2 is a scanned image of an SEM micrograph showing carbon nanotubes grown on polycrystalline nickel at a higher plasma intensity under the conditions listed in Table 1(B). Most of the nanotube diameters are smaller (~250 nm), and their distribution is narrower, ranging from 200 to 300 nm. With increased plasma intensity, the density increased to $4\times10^6$ nanotube/mm$^2$, about 4 times higher than that shown in FIG. 1. The increase of plasma intensity apparently reduces the catalytic nickel particle size, which leads to both thinner carbon nanotubes and improved nanotube uniformity.

Figure 3:
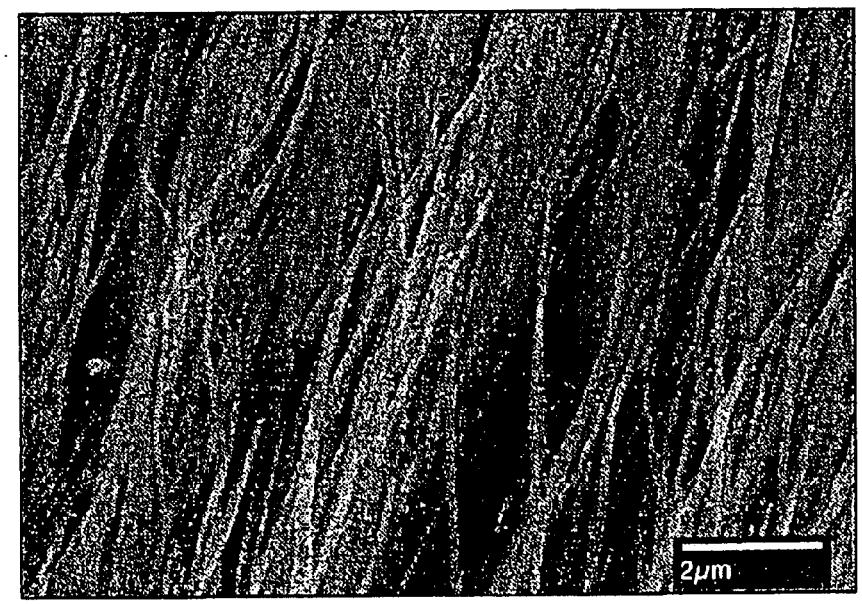
FIG. 3 is a scanned image showing carbon nanotubes with higher aspect ratios synthesized with a higher plasma intensity than that used for the carbon nanotubes shown in FIG. 2.

FIG. 3 is a scanned image of an SEM micrograph showing carbon nanotubes grown under the conditions listed in Table 1(C). These carbon nanotubes were synthesized at a higher plasma intensity than that used for the carbon nanotubes of FIG. 2. In order to keep the substrates at low temperature, the filament current was reduced from 9 to 6 amperes. As shown in FIG. 3, the carbon nanotubes are at least 10 μm long, and the diameters are <100 nm. By increasing plasma intensity, two structural changes are readily observed. First, there is a substantial decrease in the average tube diameters from ~250 nm, as shown in FIG. 2, to ~100 nm, as shown in FIG. 3. Second, the tube lengths increase dramatically. This high growth rate is very attractive for the potential large-scale production of carbon nanotubes with long lengths. However, when the diameters are <20 nm, the tubes are less straight than for those with diameters >50 nm.

Figure 4:
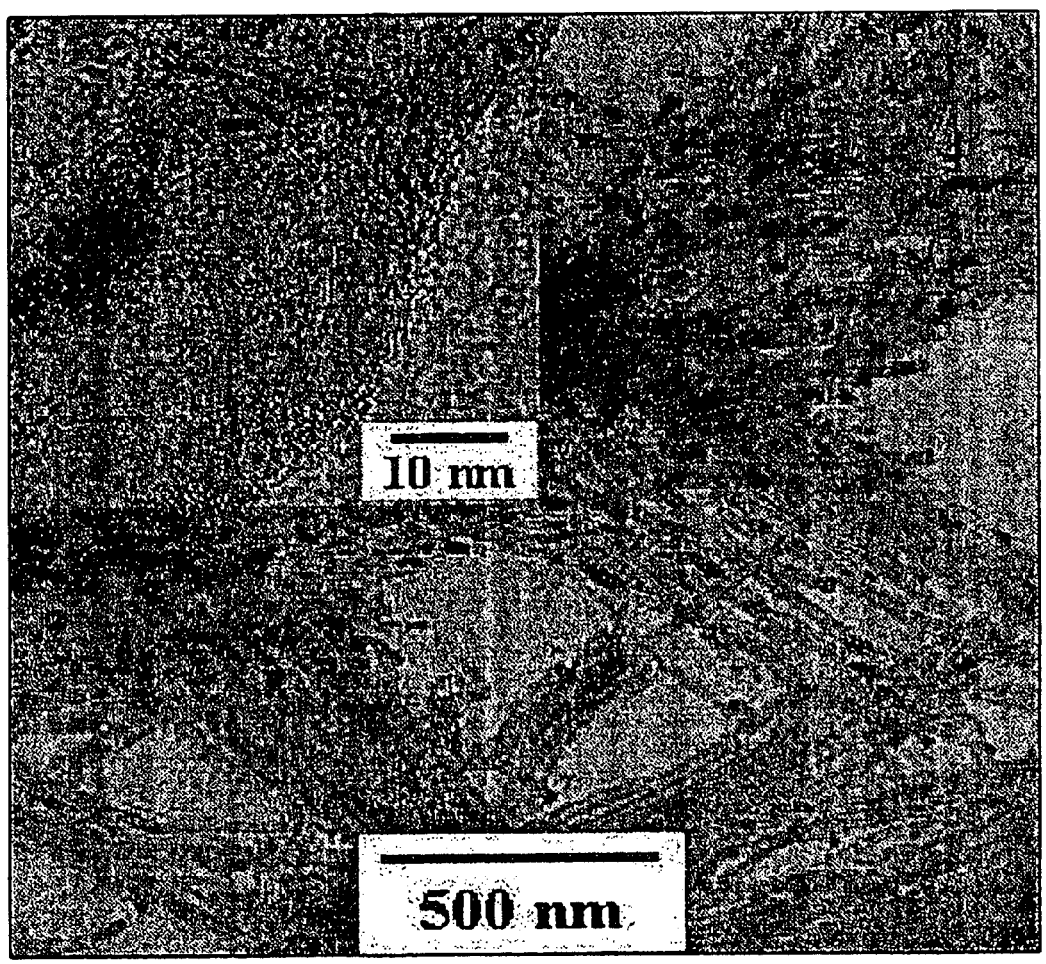
FIG. 4 is a scanned image showing a cluster of carbon nanotubes scraped off a Ni substrate directly onto a Cu TEM grid, with the insert showing a cross-section image from a portion of a single multi-walled carbon nanotube structure.

High resolution transmission electron microscopy (TEM) analysis of the carbon nanotubes shows these film structures to be truly carbon nanotubes, as opposed to carbon fiber-like structures. Samples with carbon nanotubes grown to several microns in length were scraped off a nickel substrate directly onto a copper TEM grid for analysis. FIG. 4 shows a typical image obtained for these carbon nanotubes. The disorder is due entirely to the random process of nanotube collection on the TEM grid. The dark spot at the end of each structure is a cap of a small ball of catalyst layer material, nickel in the instant example. This image is typical to those reported elsewhere demonstrating a carbon nanotube structure. Nevertheless, the insert to FIG. 4, a high-resolution image of a portion of a typical carbon nanotube structure, is more convincing. The width of this tube is ~30 nm and represents a highly defected multi-walled structure with a hollow core. The core diameter is about 20 nm and the wall thickness is about 5–10 nm. The fringes on each side of the tube identify individual cylindrical graphitic layers. This particular carbon nanotube is a structure with approximately 15 walls of graphitized carbon. Both the angular bend in the structure and the appearance of carbon walls running across the diameter of the nanotube demonstrate structural defects suggestive of twisting of the nanotube structure. As can be seen at the structural defects, non-continuous walls intersect one another. On an atomic scale, the defects create active surface cites for permeability through the nanotube structure. The lack of fringes inside the nanotube, as well as the lighter contrast as compared to the nanotube walls, indicates that the core of the structure is hollow.

Example 2

Substrate Preparation

Display glass having a strain point temperature of 666° C. was cut into 10×5 mm pieces and cleaned in acetone by ultra-sonication. The cleaned pieces were mounted onto the surface of a stainless steel resistive heater, and the whole assembly was placed into a magnetron sputtering chamber. The chamber was pumped down below $8\times10^{-6}$ Torr before argon gas was introduced into the chamber to maintain a working pressure of 20–60 mTorr. A nickel catalyst layer of 15 to 60 nm in thickness was deposited onto the glass substrates by magnetron sputtering for about 1.5 to 6 minutes. During deposition, the substrates were either heated or kept at room temperature.

Catalyst layered substrates were placed to a CVD chamber, which was pumped down below $6\times10^{-6}$ Torr. As soon as the chamber pressure reached $6\times10^{-6}$ Torr, acetylene and ammonia gases were introduced into the chamber to maintain a working pressure of 1–20 Torr during carbon nanotube growth. The total flow rate of acetylene and ammonia gases was 120–200 sccm with a volume ratio of acetylene to ammonia varying from 1:2 to 1:10. After the working pressure stabilized, the power to the tungsten filament coil and to the plasma-generator, as described in Example 1, were energized to generate heat and plasma at a temperature below 666° C. to induce carbon nanotube growth under the conditions listed in Table 2. Carbon nanotube samples were examined in the manner described in Example 1. In particular, scanning electron microscopy was used to investigate the effect of various growth conditions on the morphology of carbon nanotubes grown on nickel-coated display glass.

Figure 5A:
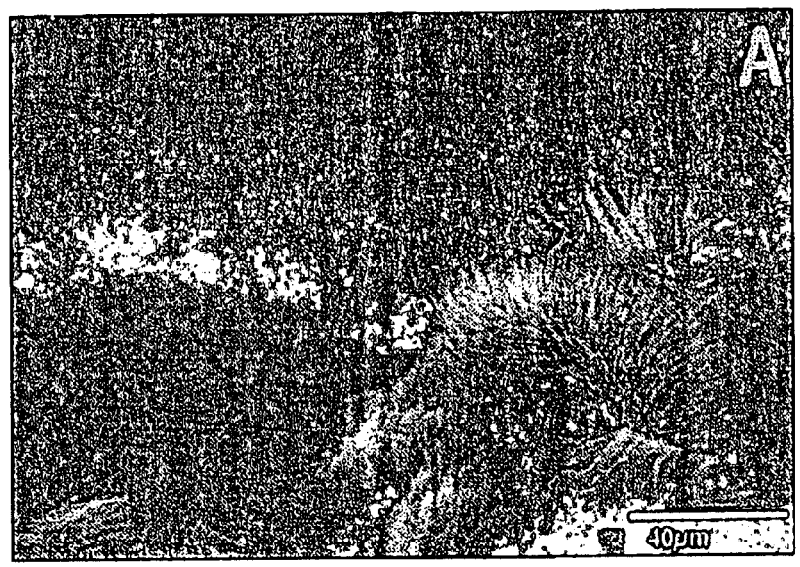
FIGS. 5A–B are scanned images showing carbon nanotubes aligned substantially perpendicular to a substrate over large areas growth conditions as listed in Table 2.
Figure 5B:
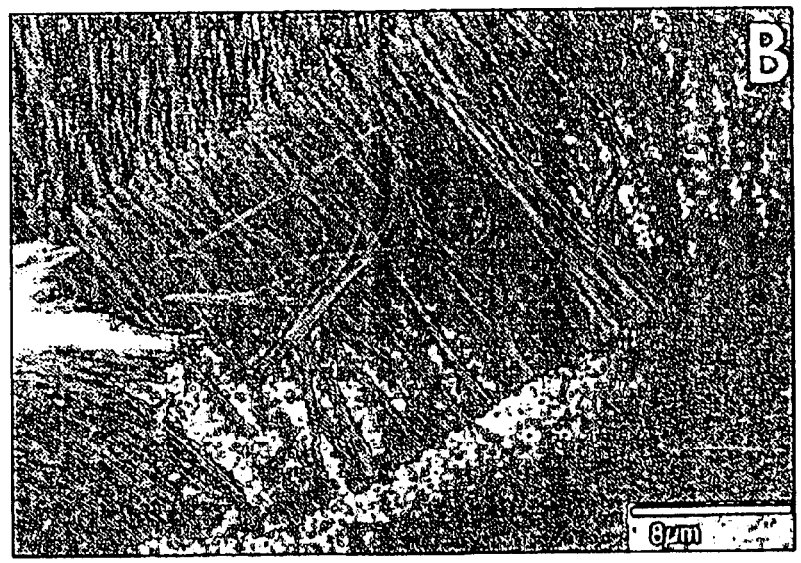

As described in Table 2(A), $NH_3$ was introduced during the first 5 minutes without introducing $C_2H_2$. During this time, the catalyst layer was plasma etched to reduce its thickness to less than 40 nm. After these initial 5 minutes, $C_2H_2$ was introduced. Immediately, a color change occurred as a result of the growth of carbon nanotubes. The growth period lasted only 10 minutes. Referring to FIGS. 5A–B, in order to examine the orientation and alignment of the carbon nanotubes on the glass substrates, part of the carbon nanotube-covered area was peeled off (lower left in FIG. 5A) with a tweezer to expose the glass substrate. During peeling, another area was crumpled (lower right in FIG. 5A), and a long scratch was made on the peeled open area (lower left in FIG. 5A). Under visual and SEM observations, the alignment of the carbon nanotubes across the whole surface was as uniform as in the upper part of FIG. 5A. To estimate the carbon nanotube length, an SEM was taken at higher magnification along the peeled edge (FIG. 5B). Misalignment of the carbon nanotubes on the peeled edge resulted from the peeling operation. From FIG. 5B, it was estimated that the nanotubes were about 100 nm in diameter and 20 μm in length. Given the growth time of 10 minutes, the growth rate was calculated to be 120 μm/hour, about 5 times faster than the value reported in Li.

Figure 6A:
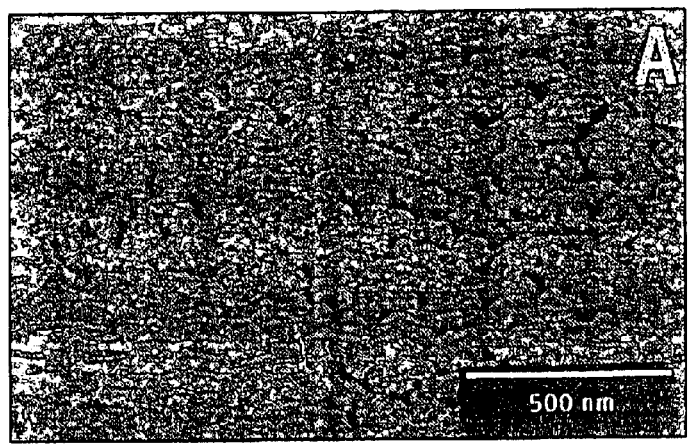
FIGS. 6A–C are scanned images showing scanning electron microscope surface morphology of the nickel catalyst layers.
Figure 6B:
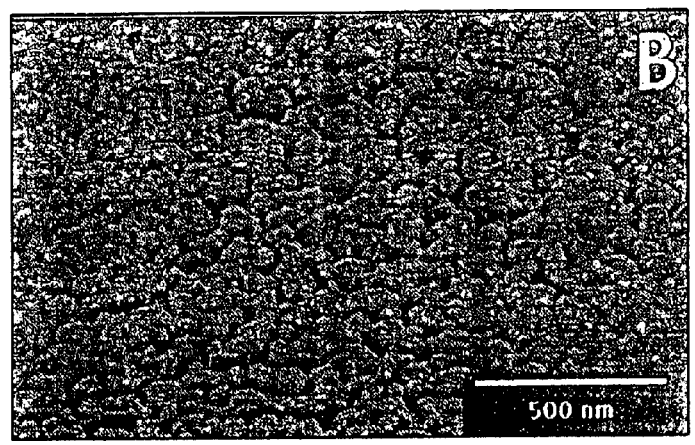
Figure 6C:
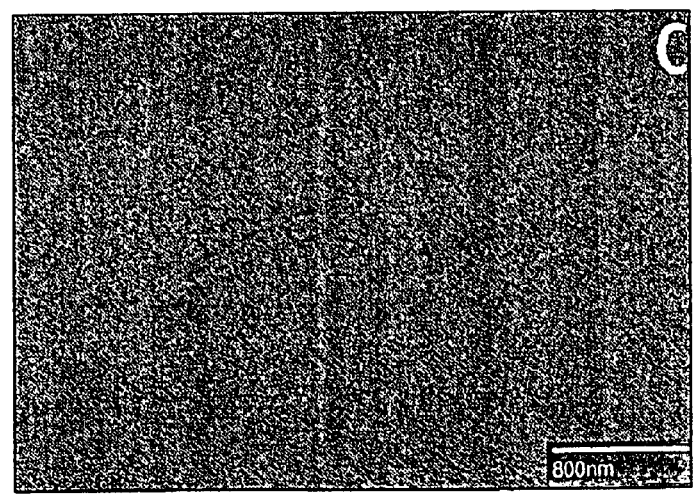

As respectively shown in FIGS. 6A and 6B, the surfaces of the nickel layer after the initial $NH_3$ or $N_2$ plasma etching are essentially the same. The plasma etching conditions are respectively listed in Table 2(B) and 2(C). For comparison, FIG. 6C shows the as-sputtered smooth nickel surface. Although both $NH_3$ and $N_2$ plasma etching roughen the nickel surface, the roughing of the nickel surface is not responsible for the nucleation and growth of carbon nanotubes.

Interestingly, when the sequence of gas introduction is reversed, that is, when $C_2H_2$ is introduced first, 5 minutes later, followed by $NH_3$, no growth of carbon nanotubes is observed, only amorphous carbon is formed on the nickel surface. The amorphous carbon layer forms in the first 5 minutes and $C_2H_2$ plasma covered the nickel surface to inhibit the catalytic role of nickel so that there is no growth of carbon nanotubes. Apparently, carbon nanotubes grow only when catalyst gas ($NH_3$) is introduced first followed by the carbon source gas ($C_2H_2$) or both the carbon source and catalyst gases ($C_2H_2$ and $NH_3$, respectively) are introduced simultaneously. Thus, it may be concluded that $NH_3$ plays a crucial catalytic role together with the nickel layer to promote the growth of the carbon nanotubes. The catalytic role of $NH_3$ is further confirmed by the fact that there is no carbon nanotube growth when $NH_3$ was replaced by $N_2$ gas at temperatures below 700° C. with other conditions unchanged. However, carbon nanotubes do grow when $NH_3$ is replaced by $N_2$ at temperatures above 700° C. utilizing PE-HF-CVD.

In order to examine the effect of thickness of the metal catalyst layer on the growth of carbon nanotubes, $C_2H_2$ and $NH_3$ were introduced at the same time under the conditions listed in Table 2(D). Under these growth conditions, no plasma etching occurred, and the nickel layer remained 40 nm thick.

Figure 7A:
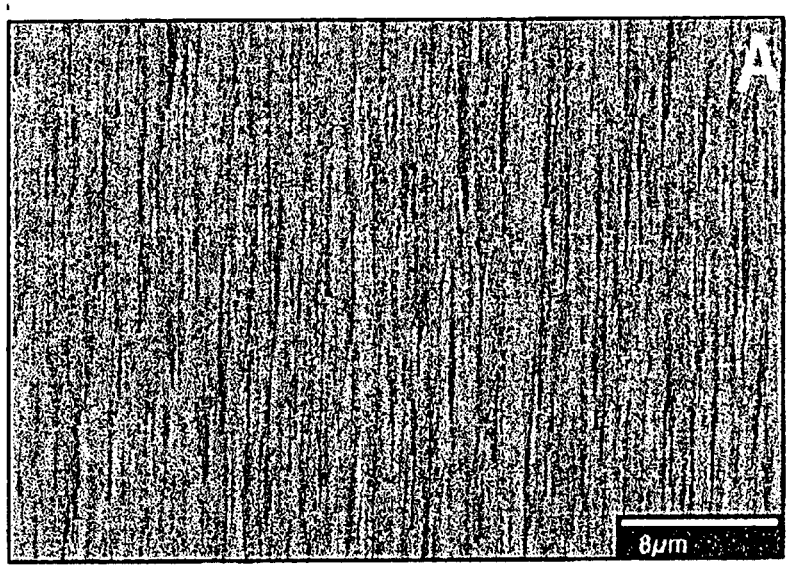
FIGS. 7A–B are scanned images showing carbon nanotubes grown under the conditions listed in Table 2.
Figure 7B:
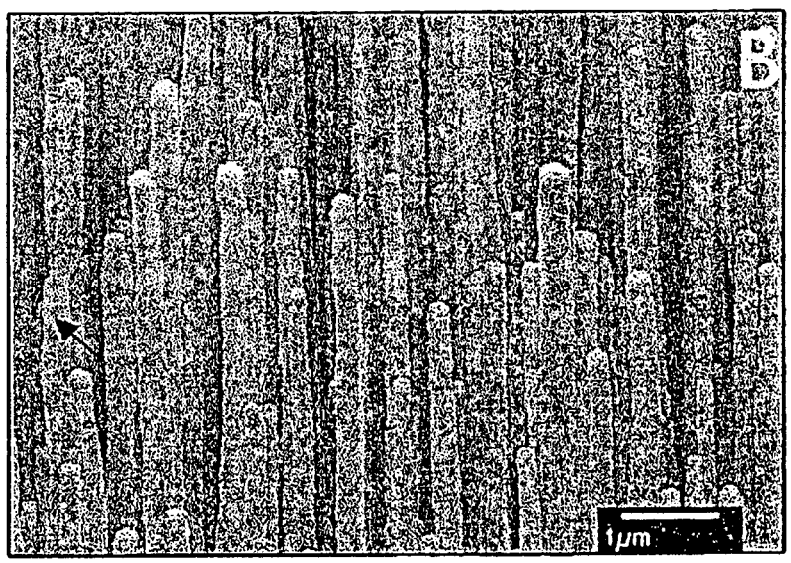

Referring to FIG. 7A, carbon nanotubes have an estimated site density of about $10^7$ tubes/mm². The diameters of the carbon nanotubes (FIG. 7A) are much larger than those in FIG. 5B. From FIG. 7B, it is estimated that the outside diameters of the carbon nanotubes range from 180 to 350 nm, and most of the carbon nanotubes are about 250 nm in diameter. Although not shown, carbon nanotubes have been grown in accordance with this method with diameters as large as 500 nm. This experiment clearly shows that as the catalyst layer thickness is reduced, the diameters of the resultingly grown carbon nanotubes are likewise reduced. As shown in FIG. 7B, the catalytic role of nickel is also clearly indicated by the nickel cap on the tip of each nanotube. Interestingly, one carbon nanotube, as indicated by an arrow in FIG. 7B, does not have a nickel cap. Due to the absence of a cap on the identified nanotube, it may be concluded that the carbon nanotubes are empty with a very thin wall. In support of this conclusion, another carbon nanotube is viewable behind the capless one through its wall. Surprisingly, the nanotubes have a central core which is larger than reported values in literature. These large carbon nanotubes may be useful for applications such as storage of gases, such as $H_2$, and as microelectrodes.

Figure 8A:
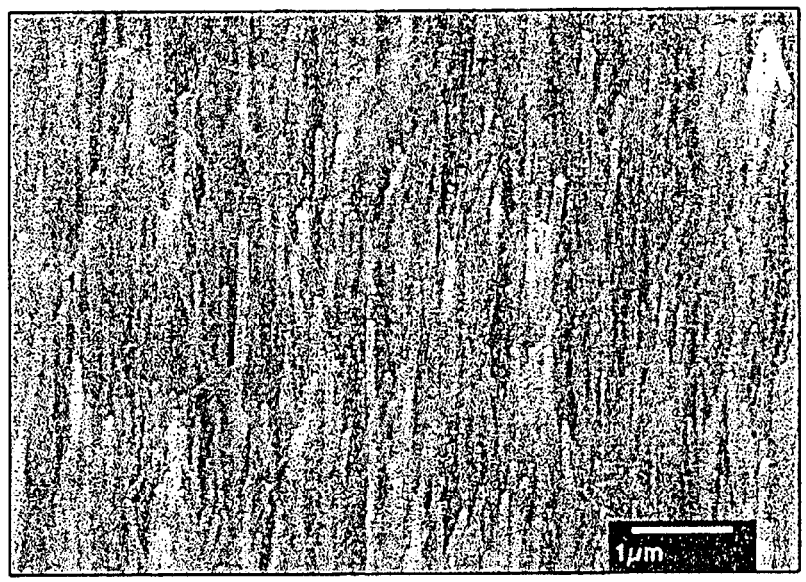
FIG. 8A is a scanned image showing thinner carbon nanotubes grown on thinner (15 nm) nickel-coated glass under the conditions listed in Table 2.
Figure 8B:
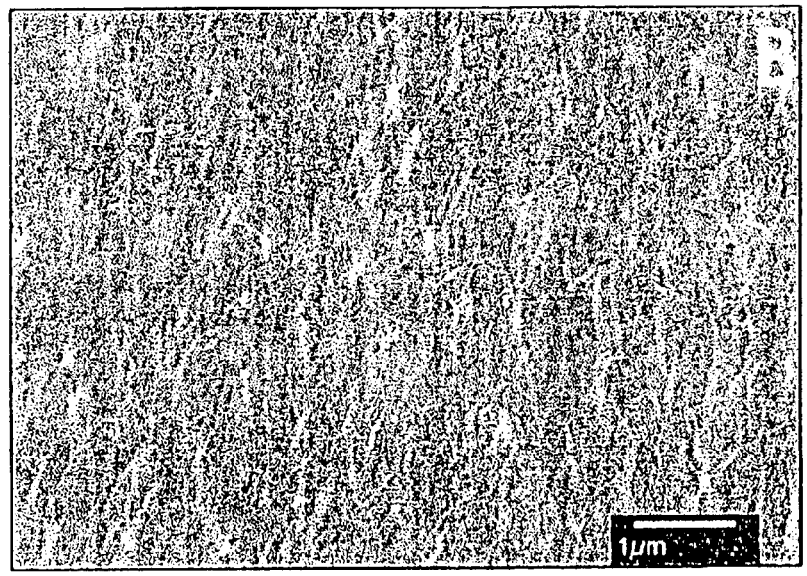
FIG. 8B is a scanned image showing carbon nanotube with approximately 20 nm diameters grown under the conditions listed in Table 2.

These experiments show a direct relationship between metal catalyst layer thickness and nanotube diameters. That is, the thinner the nickel layer, the thinner the nanotubes. To examine further the effect of nickel layer thickness on carbon nanotube growth, a much thinner nickel layer of only 15 nm is utilized under the conditions listed in Table 2(E) and 2(F). In one experiment (Table 2(F)), the nickel layer thickness is plasma etching reduced by introducing $NH_3$ first, and 20 minutes later introducing $C_2H_2$. In FIGS. 8A and 8B, respectively, SEM micrographs of carbon nanotubes grown under the conditions listed in Table 2(E) and 2(F) show the dependent relationship of nanotube diameter to the nickel layer thickness. The typical diameter of the nanotubes in FIG. 8A is only about 65 nm, compared to 240 nm in FIG. 7B. Relatively speaking, the alignment in FIG. 8A is not quite as good as in FIG. 7B. A comparison of FIGS. 8A and 8B demonstrates that 20 minutes of plasma etching reduces the thickness of nickel layer, which in turn results in even thinner carbon nanotubes with typical diameters of only about 20 nm. The comparison also shows that the alignment begins to deviate when the nanotube diameter is reduced to 20 nm. Carbon nanotubes have been produced in accordance with this method having a diameter as small as 4 nm. Therefore, for applications requiring substantial nanotube alignment, it is apparent that diameters should be larger than 50 nm for carbon nanotubes having a length of 20 μm or longer.

Again, high-resolution TEM was utilized to determine the interior and wall structures of the carbon nanotubes. Samples for a plan view TEM were prepared as follows. Given the flexible nature of the nanotubes, the carbon nanotube film was penetrated with M-Bond 610 epoxy resin (M-Line Accessories) to provide mechanical stiffness. This resin has very low viscosity and curing is time/temperature dependent. Hydrotetrafuran (diethylene oxide) makes up about 90% of the composition of M-Bond. The carbon nanotube film was immersed in acetone; then M-Bond epoxy is slowly added until a 1:1 ratio is attained. The sample was cured at room temperature for 48 hours. Because the viscosity of the epoxy was very low when introduced to the sample, it easily impregnated the pores to completely mix with the acetone. Standard mechanical thinning and ion milling (low angle, low voltage and current) was used to thin the sample to electron transparency. Most of the substrate was removed mechanically, followed by ion milling until the film was exposed. Then, both sides were ion milled for 15 minutes.

Figure 9A:
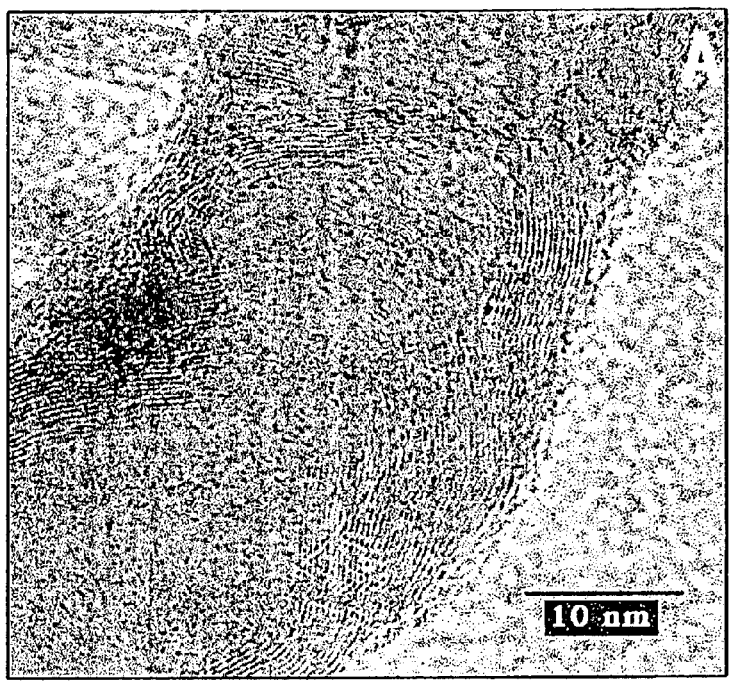

FIG. 9A shows a cross-sectional view of a typical thinner carbon nanotube. This carbon nanotube is a multi-walled central hollow tube with an outside diameter of nearly 30 nm. The fringes on each side of the tube represent individual cylindrical graphitic layers. This particular carbon nanotube has approximately 15 walls of graphitized carbon. Both the angular bend in the structure and the appearance of carbon walls running across the diameter of the nanotube demonstrate structural defects suggestive of twisting of the nanotube structure. The lack of fringes inside the tube, as well as the lighter contrast compared to the nanotube walls indicates that the core of the structure is hollow.

Figure 9B:
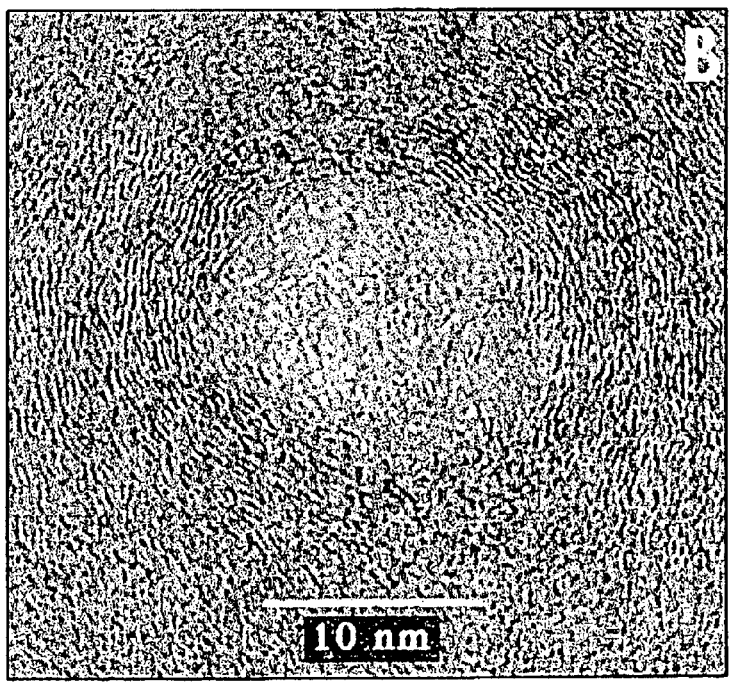

Further evidence of the hollow core is shown in FIG. 9B. This is a high-resolution plan view TEM image of a single carbon nanotube structure. Here, the hollow nature of the nanotube, again represented by the lighter contrast of the inner core, is more readily observable. The disorder seen in the wall fringes circumventing the hollow center are most likely caused by the twist-like defects throughout the carbon nanotube length as shown in FIG. 9A. These high-resolution TEM images show that the structures are hollow, multi-walled carbon nanotubes with defects existing along the tube. The defects of bending and twisting of the carbon nanotubes of the thin carbon nanotubes shown in FIGS. 9A and 9B are consistent with the SEM observation in FIG. 8B. Further, there is a inverse relationship between CVD temperature and defect density. As the deposition temperature is reduced, the carbon nanotubes demonstrate an increase in the number of defects which occur in the wall. On an atomic scale, these defects render the wall of the carbon nanotube discontinuous. This results in an extremely high, active, and accessible surface area due to the substantial alignment of and relatively large spacing between the carbon nanotubes. These discontinuations in the wall structure provide atomic disorder which results in an active surface through which atomic level diffusion can occur.

TABLE 2

Growth conditions for nanotubes shown in FIGS. 5, 6, 7, and 8.

| $C_2H_2/NH_3/N_2$ (sccm/sccm) | Filament Current (amperage, A) | Plasma Intensity (amperage/voltage/watts) | Growth Time (minutes) |
|---|---|---|---|
| (A): For FIGS. 5A and 5B: | | | |
| 0/160/0 | 8.5 | 0.10/635/72 | 5 |
| followed by | | | |
| 80/160/0 | 8.5 | 0.13/670/95 | 10 |
| (B): For FIG. 6A: | | | |
| 0/160/0 | 8.5 | 0.09/740/66 | 3 |
| (C): For FIG. 6B: | | | |
| 0/0/296 | 8.5 | 0.10/480/53 | 3 |
| (D): For FIG.s 7A and 7B: | | | |
| 80/160/0 | 8.5 | 0.20/700/150 | 25 |
| (E): For FIG. 8A: | | | |
| 40/160/0 | 7.2 | 0.13/650/90 | 14 |
| (F): For FIG. 8B: | | | |
| 0/160/0 | 8.0 | 0.10/480/52 | 20 |
| followed by | | | |
| 80/160/0 | 8.2 | 0.10/560/60 | 10 |

Example 3

Figure 10:
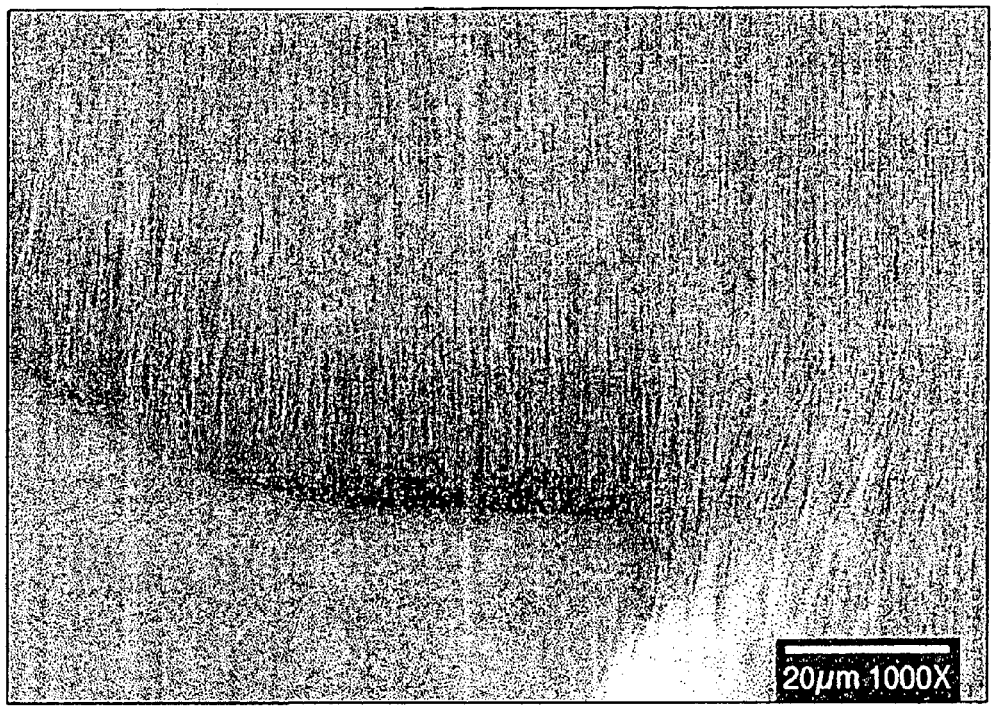
FIG. 10 is a scanned image showing the large area growth of well-aligned carbon nanotubes on glass.

A glass substrate was prepared as in Example 2 with a 10–40 nm thick nickel catalyst layer having an as-sputtered smooth surface, as shown in FIG. 6C. Carbon nanotubes were grown by PE-HF-CVD for about 10 minutes as in Examples 1 and 2, except the acetylene and ammonia volume ratio was 1:2 to 1:4. FIG. 10 shows a large area growth of substantially vertically aligned carbon nanotubes. The length of the carbon nanotubes is up to 50 µm. The diameters are estimated to be in the range of 100–150 nm (See FIG. 14).

Example 4

Figure 11:
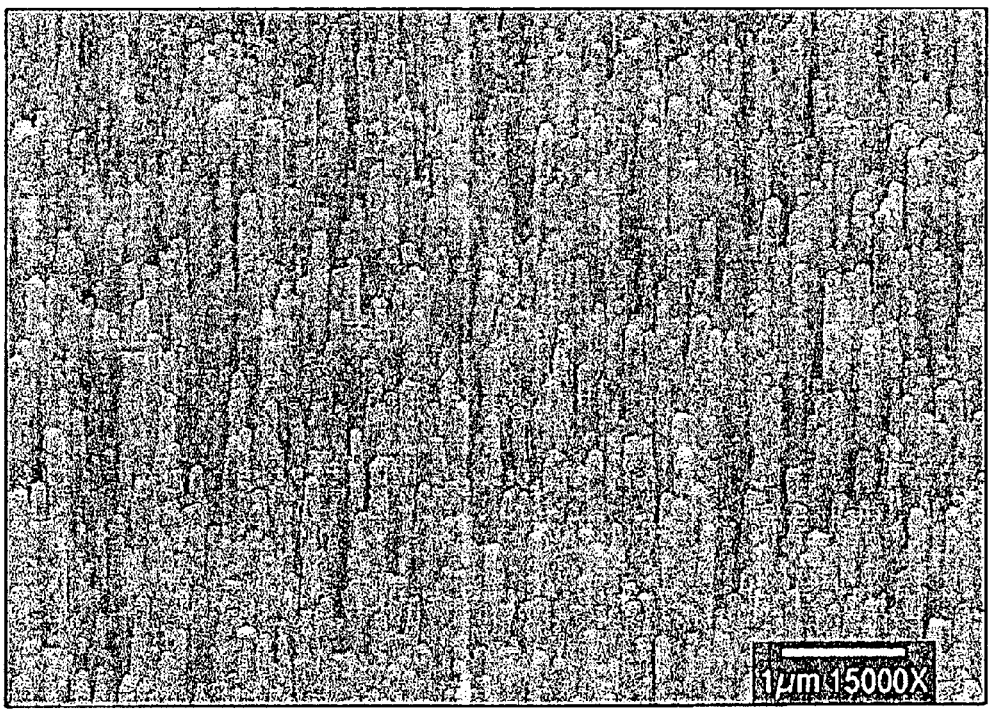
FIG. 11 is a scanned image showing well-aligned carbon nanotubes on silicon.
Figure 12:
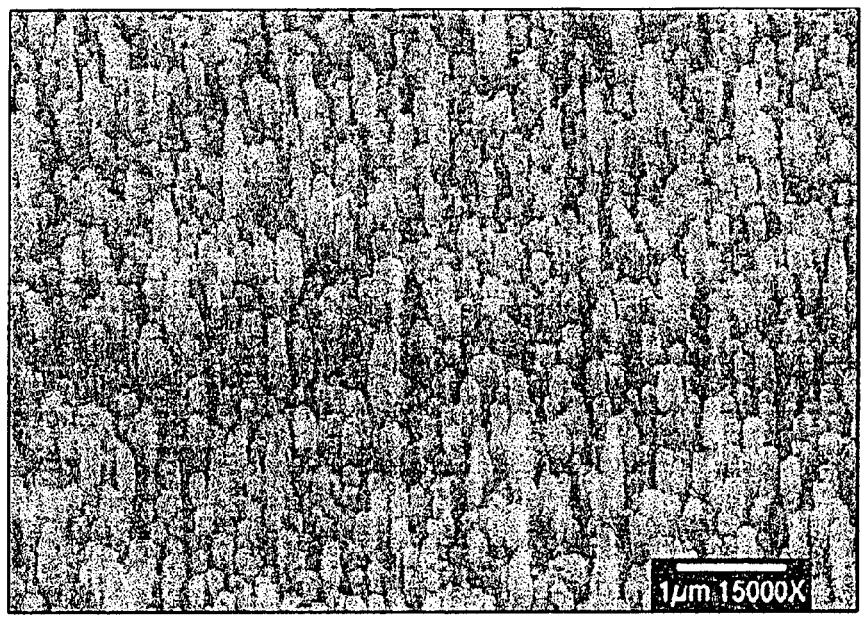
FIG. 12 is a scanned image showing very short carbon nanotubes grown on silicon for only 2 minutes.

Single crystal, p-type boron doped 9.5 Ω-cm (100) silicon substrates were prepared as in Example 2 with a 10–40 nm thick nickel catalyst layer having an as-sputtered smooth surface, as shown in FIG. 6C. Carbon nanotubes were grown by PE-HF-CVD as in Examples 1 and 2, except the acetylene to ammonia volume ratio was 1:2 to 1:4. FIGS. 11 and 12 show carbon nanotubes which were grown for 5 and 2 minutes, respectively. Referring to FIG. 11, substantially perpendicular carbon nanotube alignment is clearly shown. A nickel cap, which acts as a catalyst to sustain growth, is also discernible at the top of each carbon nanotube. Early stage carbon nanotube growth is shown FIG. 12, since the growth was stopped at 2 minutes. The shortest nanotubes are about 0.1 µm.

Example 5

Figure 14:
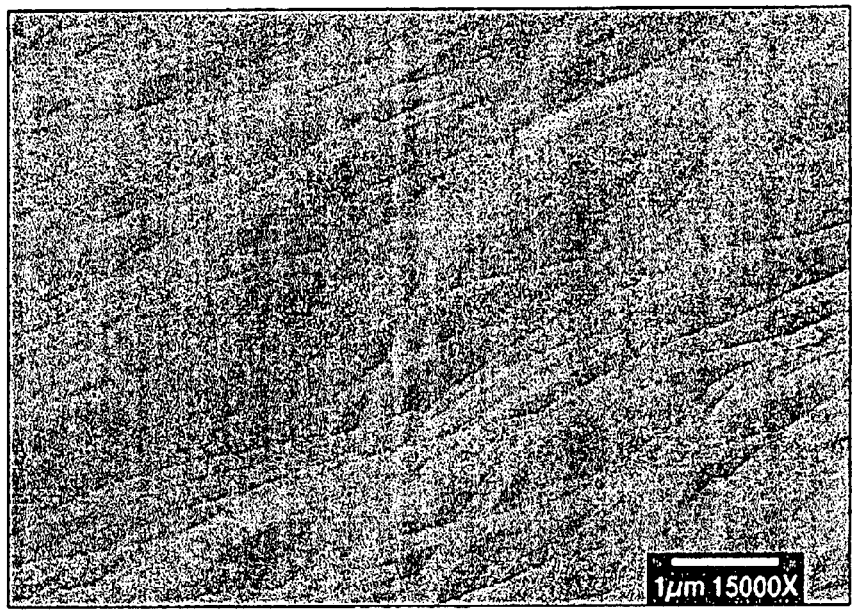
FIG. 14 is a scanned image showing carbon nanotubes subjected to Ar ion sputtering.

Carbon nanotubes were grown as in Example 3. The catalyst metal caps were thereafter removed by $HNO_3$ solution etching and Ar ion sputtering. FIGS. 13 and 14 show the SEM image of the nanotubes after removal of the nickel caps by $HNO_3$ solution etching and Ar ion sputtering, respectively. The solution etching by $HNO_3$ only took about one minute, and the removal of nickel caps is complete. As shown in FIG. 13, the ends of the carbon nanotubes are open after etching. Morphologically, there was no observable damage by the $HNO_3$ etching. In FIG. 14, all the nanotubes were bent by the Ar ion sputtering, and the nickel caps were not completely removed. These techniques may be utilized to remove any of the metal or metal alloy caps. By removing the caps, various fillings (i.e. hydrogen, lithium ions, bismuth, lead telluride, bismuth tritelluride, a pharmacological agent, etc.) can be added to the nanotube core. Thereafter, if desired, the open ends can be sealed by electrochemical deposition of a metal onto the carbon nanotubes.

Example 6

Figure 15:
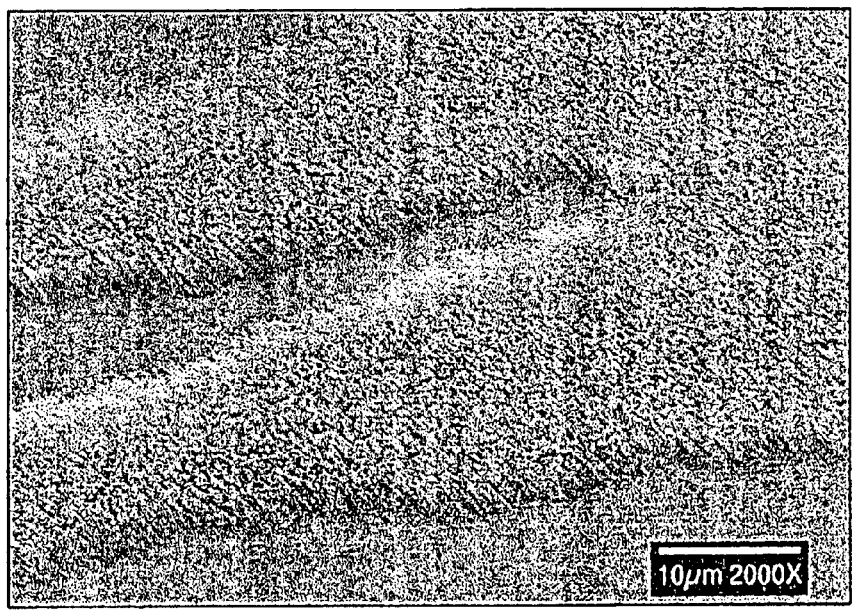
FIG. 15 is a scanned image showing a side view of well-aligned carbon nanotubes grown at an angle with respect to the substrate.
Figure 16:
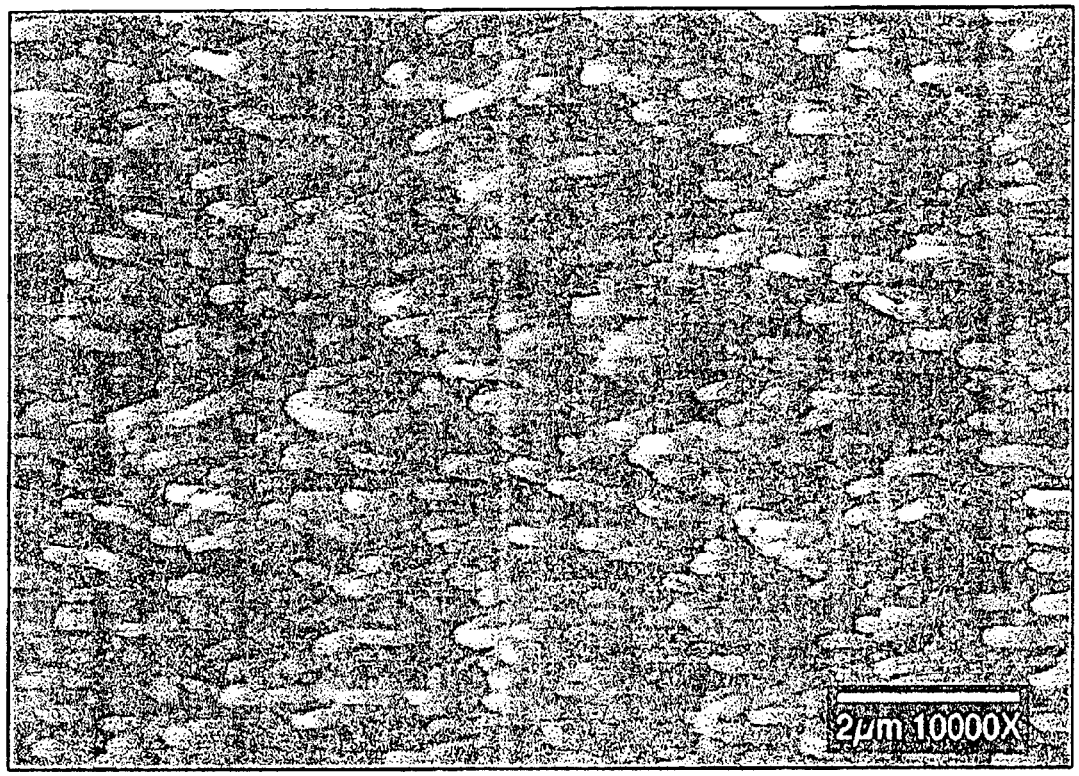
FIG. 16 is a scanned image showing a top view of the carbon nanotubes of FIG. 15.

Carbon nanotubes were grown as in Example 3, except the substrates were placed in the CVD chamber at differing angles with respect to the plasma generator. Although the carbon nanotubes grew substantially aligned with one another, the alignment was independent of substrate surface topography. FIGS. 15 and 16 show the SEM image taken from side and top on a sample sit tilted at a certain angle during growth. It is observed that carbon nanotube alignment is not perpendicular to the substrate surface, but rather is angled with respect to the substrate. The tilt direction is closely related to the direction of the electrical field which generates the plasma. This technique may be utilized to grow aligned carbon nanotubes at any angle with respect to the substrate, including nanotubes lying in a plane.

Example 7

A catalyst layer of nickel was deposited on a p-type boron doped 9.5 Ω-cm (100) silicon substrate by electron beam lithography and metal evaporation. A bilayer electron-beam resist (5% 100 molecular weight polymethylmethacralate) was capped by 2% 950 molecular weight polymethylmethacralate that was patterned with a JEOL J6400 SEM converted for lithography. The resist was developed in a solution of methyl isobutyl ketone and isopropyl alcohol (3:1). Thereafter, 150 Å of nickel was deposited by electron beam evaporation. A catalyst layer (i.e. a large, ~0.25 mm² nickel pad or one or more nano-dots) remained after resist/metal liftoff in acetone.

Carbon nanotubes were grown by PE-HF-CVD as in the process in Example 2, except growth was performed at a pressure of 1–10 Torr with an acetylene to ammonia volume mixture of 1:4 at a total flow rate of 200 sccm for about 5 minutes.

Figure 17A:
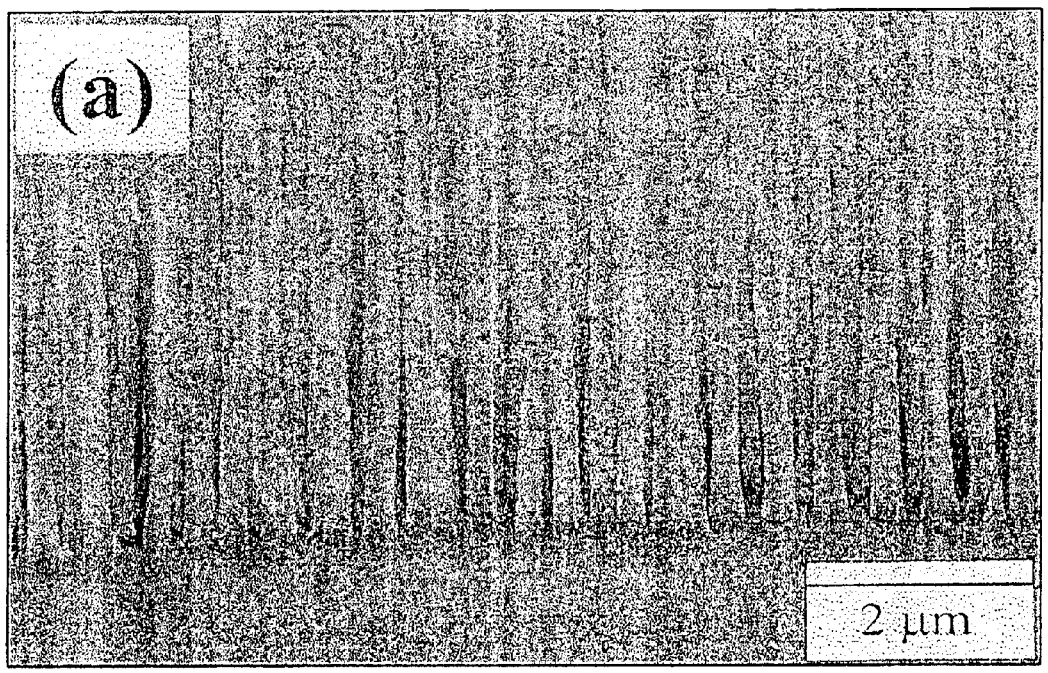
FIG. 17A is a scanned image showing grown carbon nanotubes at the edge of a metal pad.
Figure 17B:
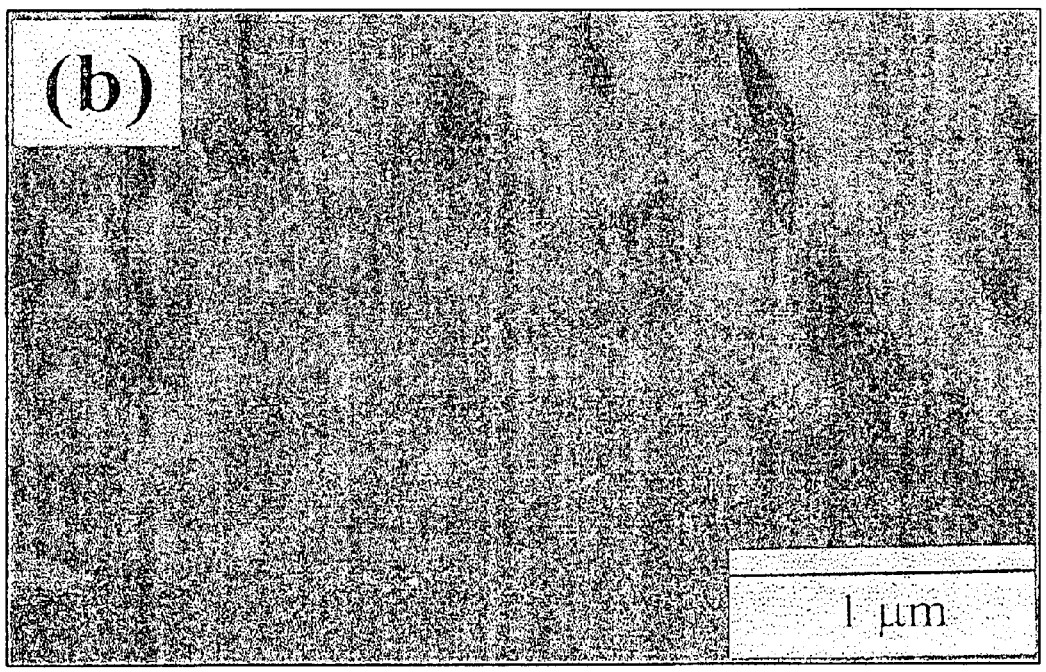
FIG. 17B is a scanned image showing a region similar to FIG. 17A in which the carbon nanotubes are broken.

Referring to FIGS. 17A–B, scanned images of SEM micrographs show carbon nanotubes grown on the silicon substrate in the region of the edge of the nickel pad. As shown in FIG. 17A, absence of nanotube growth in the foreground demonstrates selective growth on the nickel catalyst film and not on the silicon substrate. FIG. 17B shows these nanotubes after being mechanically broken using tweezers. Surprisingly, the tubes break somewhere along the tube and not at the interface between the nickel and silicon. This observation is different that that of nickel-on-glass nanotube growth, where the nanotubes broke cleanly at the nickel-glass interface, as shown in FIG. 5A.

Example 8

Nickel catalyst nano-dot patterns were deposited on a p-type boron doped 9.5 Ω-cm (100) silicon substrate by electron beam lithography and metal evaporation as in Example 7. Carbon nanotubes were grown by PE-HF-CVD as in the process in Example 7, except the growth temperature was between 300° C. and 666° C. and only a single, free-standing carbon nanotube grew on each nickel nano-dot. Thereafter, carbon samples were examined by SEM, TEM, XPS, etc. techniques as discussed above.

FIG. 18 is a series of SEM micrographs illustrating the growth of single, multiwall carbon nanotube obelisks on respective nickel catalyst nano-dots. The catalyst nano-dots are shown in arrays of ~100 nm catalyst nano-dots. The site and spacing are precisely controlled. FIGS. 18A, 18C, 18E, and 18F are perspective views of the nanotubes, and FIGS. 18B and 18D are top views of the nanotubes. FIGS. 18A and 18B demonstrate selective growth of the nanotubes on the several repeated array patterns. The nanotubes accurately reflect the spacing and periodicity of the lithographically patterned catalyst nano-dots. FIGS. 18C and 18D reflect higher magnification and show the repeated array pattern where the nanotubes are spaced either 2 $\mu$m apart (left portion of array) or 1 $\mu$m apart (right portion of array).

The sharp, tapered tips of the nanotubes shown in FIGS. 18E, 18F, and 19 are unique to carbon nanotubes grown on nano-dots under the instant conditions. Notably, such nanotubes do not have a cap of the catalyst material. In FIG. 18F, the nano-dots are spaced 5 $\mu$m apart. The non-uniformity of height (0.1 to 5 $\mu$m) is apparently not related to the spatial position. Rather, it is believed to be due to non-uniform electron beam lithography and electron beam evaporation of the catalyst nano-dots onto the substrate. With precise control of the electron beam lithography, all carbon nanotubes should be substantially uniform in height. Nanotube length is dependent upon the growth time and the thickness of the nano-dot, whereas nanotube diameter depends upon the diameter of the nano-dot. It can be observed that although the heights vary, the diameters are generally uniform at ~150 nm. By utilizing controlled nano-dot placement on the substrate, single or multiple carbon nanotubes with controlled site density can be achieved. For example, the direct growth of a single carbon nanotube on the probe tip of scanning tunneling microscope (STM), atomic force microscope (AFM), etc. may be achieved. Well-defined spacing of multiple carbon nanotubes with multi-electron beam lithography can improve the patterning ability by $10^4$–$10^6$ times.

Although the invention has been described in detail for the purpose of illustration, it is understood that such detail is solely for that purpose, and variations can be made therein by those skilled in the art without departing from the spirit and scope of the invention which is defined by the following claims.

What is claimed:

1. A product comprising:
   a substrate having an outer surface and a strain point or a melting point temperature between about 300° C. and 700° C. and
   one or more plasma enhanced chemical vapor deposited graphitized carbon nanotubes formed on and extending outwardly from the outer surface of the substrate.

2. The product according to claim 1 wherein the one or more carbon nanotubes are present at a density greater than $10^4$ nanotubes per square millimeter of substrate.

3. The product according to claim 1, wherein the one or more carbon nanotubes extend outwardly from and substantially perpendicular to the substrate.

4. The product according to claim 1, wherein the one or more carbon nanotubes extend outwardly from and at a non-perpendicular angle with respect to the substrate.

5. The product according to claim 1, wherein the one or more carbon nanotubes are substantially parallel to the substrate.

6. The product according to claim 1, wherein the one or more carbon nanotubes have a diameter between 4 to 500 nanometers.

7. The product according to claim 1, wherein the one or more carbon nanotubes have a diameter of at least 50 nanometers.

8. The product according to claim 1, wherein the substrate comprises glass, silica, quartz, silicon, iron, cobalt, nickel, an alloy of iron, cobalt, or nickel, platinum, a ceramic, or a combination thereof.

9. The product according to claim 1, wherein the substrate is a glass plate.

10. The product according to claim 1, wherein substantially all of the one or more carbon nanotubes have an open end.

11. The product according to claim 1, wherein the one or more carbon nanotubes are present at a density no greater than $10^2$ nanotubes per square millimeter of substrate.

12. The product according to claim 1, wherein the one or more carbon nanotubes are graphitized carbon nanotubes.

13. The product according to claim 1, wherein the substrate comprises a catalyst.

14. The product according to claim 13, wherein the substrate is formed of the catalyst.

15. The product according to claim 13, wherein the catalyst is a metal or metal alloy and wherein substantially all carbon nanotubes have a cap distal from the substrate, the cap comprising the metal or metal alloy.

16. The product according to claim 15, wherein the metal or metal alloy is iron, cobalt, nickel, or an alloy of iron, cobalt, or nickel.

17. The product according to claim 16, wherein the metal or metal alloy is nickel.

18. The product according to claim 1, further comprising a filling within the one or more carbon nanotubes.

19. The product according to claim 18, wherein the filling is hydrogen, lithium ions, bismuth, lead telluride, or bismuth tritelluride.

20. The product according to claim 18, wherein the filling is a pharmacological agent.

21. The product according to claim 18, wherein the filling is enclosed within the carbon nanotubes.

22. The product according to claim 18, wherein substantially all of the one or more carbon nanotubes have an open end.

23. A field emission display comprising:
   a baseplate having an electron emitting array positioned thereon, the baseplate comprising a substrate and one or more free-standing plasma-enhanced chemical vapor deposited graphitized carbon nanotubes originating and extending outwardly from an outer surface of the substrate; and
   a phosphor coated plate spaced apart from the baseplate so that electrons emitted from the array impinge on the phosphor coating wherein the substrate has a strain or a melting point temperature between about 300 and 700° C.

24. The product according to claim 13, wherein the substrate includes a substrate layer and a continuous or non-continuous catalyst layer between the substrate layer and the plurality of substantially aligned carbon nanotubes.

* * * * *